(12) United States Patent
Tanizaki et al.

(10) Patent No.: US 7,295,465 B2
(45) Date of Patent: Nov. 13, 2007

(54) THIN FILM MAGNETIC MEMORY DEVICE REDUCING A CHARGING TIME OF A DATA LINE IN A DATA READ OPERATION

(75) Inventors: Hiroaki Tanizaki, Hyogo (JP); Hideto Hidaka, Hyogo (JP); Tsukasa Ooishi, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 11/374,062

(22) Filed: Mar. 14, 2006

(65) Prior Publication Data

US 2006/0152971 A1 Jul. 13, 2006

Related U.S. Application Data

(62) Division of application No. 10/932,057, filed on Sep. 2, 2004, now abandoned, which is a division of application No. 10/259,471, filed on Sep. 30, 2002, now Pat. No. 6,788,569.

(30) Foreign Application Priority Data

Apr. 23, 2002 (JP) .............................. 2002-121150

(51) Int. Cl.
G11C 11/14 (2006.01)
(52) U.S. Cl. .................... 365/171; 365/66; 365/158; 365/97; 365/74; 365/55; 365/33

(58) Field of Classification Search ................. 365/171, 365/66, 158, 97, 74, 55, 33
See application file for complete search history.

(56) References Cited

U.S. PATENT DOCUMENTS

| 6,205,073 B1 | 3/2001 | Naji |
| 6,349,054 B1 | 2/2002 | Hidaka |
| 6,359,805 B1 | 3/2002 | Hidaka |

(Continued)

FOREIGN PATENT DOCUMENTS

JP 61-123091 6/1986

OTHER PUBLICATIONS

"A 10ns Read and Write Non-Volatile Memory Array Using a Magnetic Tunnel Junction and FET Switch in Each Cell", Scheuerlein et al., ISSCC Digest of Technical Papers, TA7.2, Feb. 2000, pp. 94-95, 128-129, 409-410.

(Continued)

*Primary Examiner*—Viet Q. Nguyen
(74) *Attorney, Agent, or Firm*—McDermott Will & Emery LLP

(57) ABSTRACT

During data reading, a sense enable signal is activated to start charging of a data line prior to formation of a current path including the data line and a selected memory cell in accordance with row and column selecting operations. Charging of the data line is completed early so that it is possible to reduce a time required from start of the data reading to such a state that a passing current difference between the data lines reaches a level corresponding to storage data of the selected memory cell, and the data reading can be performed fast.

5 Claims, 21 Drawing Sheets

U.S. PATENT DOCUMENTS

| | | | |
|---|---|---|---|
| 6,504,752 B2 * | 1/2003 | Ito | 365/158 |
| 6,738,285 B2 * | 5/2004 | Tanizaki et al. | 365/158 |
| 6,760,244 B2 * | 7/2004 | Yamada | 365/63 |
| 6,760,251 B2 * | 7/2004 | Hidaka | 365/171 |
| 6,788,568 B2 * | 9/2004 | Hidaka | 365/158 |
| 6,788,569 B2 * | 9/2004 | Tanizaki et al. | 365/171 |
| 6,822,895 B2 * | 11/2004 | Yamada | 365/158 |
| 6,922,355 B2 * | 7/2005 | Hidaka | 365/158 |

OTHER PUBLICATIONS

"Nonvolatile RAM based on Magnetic Tunnel Junction Elements", Durlam et al., ISSCC Digest of Technical Papers, TA7.3, Feb. 200, pp. 96-97, 130-131, 410-411.

" A 256kb 3.0V 1T1MTJ Nonvolatile Magnetoresistive RAM", Naji et al., ISSCC Digest of Technical Papers, TA7.6, Feb. 2001, pp. 94-95, 122-123, 404-405, 438.

* cited by examiner

THIN FILM MAGNETIC MEMORY DEVICE REDUCING A CHARGING TIME OF A DATA LINE IN A DATA READ OPERATION

RELATED APPLICATIONS

This application is a division of application Ser. No. 10/932,057, filed Sep. 2, 2004 now abandoned which is a divisional of application Ser. No. 10/259,471, filed Sep. 30, 2002, now U.S. Pat. No. 6,788,569, which claims priority of Japanese Application No. 2002-121150, filed Apr. 23, 2002, the contents of which are hereby incorporated by reference.

BACKGROUND OF THE INVENTION

1. Field of the Invention

The present invention relates to a thin film magnetic memory device, and particularly to a thin film magnetic memory device provided with memory cells having MTJs (magnetic tunnel junctions)

2. Description of the Background Art

Attention is being given to an MRAM device as a memory device, which can nonvolatilely store data with low power consumption. The MRAM device is a memory device, in which a plurality of thin film magnetic members are formed in a semiconductor integrated circuit for nonvolatilely storing data, and the thin film magnetic members serve as memory cells allowing random access, respectively.

Particularly, in recent years, it has been announced that a performance of the MRAM device can be dramatically improved by using the thin film magnetic members, which utilize the magnetic tunnel junctions, as memory cells. The MRAM device with memory cells having the magnetic tunnel junctions has been disclosed in technical references such as "A 10ns Read and Write Non-Volatile Memory Array Using a Magnetic Tunnel Junction and FET Switch in each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 18 conceptually shows a structure of a memory cell, which has a magnetic tunneling junction, and may be merely referred to as an "MTJ memory cell" hereinafter.

Referring to FIG. 18, a MTJ memory cell includes a tunneling magneto-resistance element TMR having an electric resistance, which is variable in accordance with a data level of magnetically written storage data, and an access transistor ATR. Access transistor ATR is located between a bit line BL and a ground voltage GND, and is connected in series to tunneling magneto-resistance element TMR. Typically, access transistor ATR is formed of a field-effect transistor arranged on a semiconductor substrate.

For the MTJ memory cell, the device includes bit line BL and a digit line DL for carrying a data write current in different directions during a data write operation, respectively, as well as a word line WL for instructing data reading. In the data read operation, tunneling magneto-resistance element TMR is electrically coupled between ground voltage GND and bit line BL in response to turn-on of access transistor ATR.

FIG. 19 conceptually shows an operation of writing data in the MTJ memory cell.

Referring to FIG. 19, tunneling magneto-resistance element TMR has a ferromagnetic material layer FL, which has a fixed and uniform magnetization direction, and may be merely referred to as insulator a "fixed magnetic layer" hereinafter, and a ferromagnetic material layer VL, which is magnetized in a direction depending on an externally applied magnetic field, and may be merely referred to as a "free magnetic layer" hereinafter. A tunneling barrier (tunneling film) TB formed of an insulator film is disposed between fixed magnetic layer FL and free magnetic layer VL. Free magnetic layer VL is magnetized in the same direction as fixed magnetic layer FL or in the opposite direction in accordance with the level of the storage data to be written. Fixed magnetic layer FL, tunneling barrier TB and free magnetic layer VL form a magnetic tunneling junction.

Tunneling magneto-resistance element TMR has an electric resistance, which is variable depending on a correlation in magnetization direction between fixed magnetic layer FL and free magnetic layer VL. More specifically, the electric resistance value of tunneling magneto-resistance element TMR takes a minimum value Rmin when the magnetization directions of fixed magnetic layer FL and free magnetic layer VL are parallel to each other. When the magnetization directions of them are opposite (parallel opposite) to each other, the above electric resistance value takes a maximum value Rmax.

In the data write operation, word line WL is inactive, and access transistor ATR is off. In this state, the data write currents for magnetizing free magnetic layer VL are supplied to bit line BL and digit line DL in directions depending on the level of write data, respectively.

FIG. 20 conceptually shows a relationship between the data write current and the magnetization direction of the tunneling magneto-resistance element in the data write operation.

Referring to FIG. 20, an abscissa H(EA) gives a magnetic field, which is applied along an easy axis (EA) to free magnetic layer VL of tunneling magneto-resistance element TMR. An ordinate H(HA) indicates a magnetic field acting along a hard axis (HA) on free magnetic layer VL. Ordinate H(HA) and abscissa H(EA) correspond to two magnetic fields produced by currents flowing through bit line BL and digit line DL, respectively.

In the MTJ memory cell, the fixed magnetization direction of fixed magnetic layer FL is parallel to the easy axis of free magnetic layer VL, and free magnetic layer VL is magnetized in the direction of the easy axis, and particularly in the same parallel direction, which is the same direction as fixed magnetic layer FL, or in the opposite parallel direction, which is opposite to the above direction, depending on the level ("1" or "0") of the storage data. The MTJ memory cell can selectively store data ("1" and "0") of one bit corresponding to the two magnetization directions of free magnetic layer VL.

The magnetization direction of free magnetic layer VL can be rewritten only when a sum of applied magnetic fields H(EA) and H(HA) falls within a region outside an asteroid characteristic line shown in FIG. 20. Therefore, the magnetization direction of free magnetic layer VL does not change when the data write magnetic fields applied thereto have intensities corresponding to a region inside the asteroid characteristic line.

As can be seen from the asteroid characteristic line, the magnetization threshold required for changing the magnetization direction along the easy axis can be lowered by applying the magnetic field in the direction of the hard axis to free magnetic layer VL.

When the operation point in the data write operation is designed, for example, as shown in FIG. 20, the data write magnetic field in the MTJ cell selected as a data write target is designed such that the data write magnetic field in the direction of the easy axis has an intensity of $H_{WR}$. Thus, the data write current flowing through bit line BL or digit line DL is designed to take a value, which can provide the data write magnetic field of $H_{WR}$. In general, data write magnetic field $H_{WR}$ is represented by a sum of a switching magnetic field $H_{SW}$ required for switching the magnetization direction and a margin $\Delta H$. Thus, it is represented by an expression of $H_{WR}=H_{SW}+\Delta H$.

For rewriting the storage data of the MTJ memory cell, i.e., the magnetization direction of tunneling magneto-resistance element TMR, it is necessary to pass the data write currents at a predetermined level or higher through digit line DL and bit line BL. Thereby, free magnetic layer VL in tunneling magneto-resistance element TAR is magnetized in the same parallel direction as fixed magnetic layer FL or opposite parallel direction in accordance with the direction of the data write magnetic field along the easy axis (EA). The magnetization direction, which was once written into tunneling magneto-resistance element TMR, and thus the storage data of MTJ memory cell is held nonvolatilely until next data writing is executed.

FIG. 21 conceptually shows an operation of reading data from the MTJ memory cell.

Referring to FIG. 21, access transistor ATR is turned on in response to activation of word line WL in the data read operation. Thereby, tunneling magneto-resistance element TMR is electrically coupled to bit line BL while being pulled down with ground voltage GND.

In this state, bit line BL is pulled up with a predetermined voltage, whereby a current path including bit line BL and tunneling magneto-resistance element TMR carries a memory cell current Icell corresponding to the electric resistance of tunneling magneto-resistance element TMR, and thus corresponding to storage data of the MTJ memory cell. For example, this memory cell current Icell is compared with a predetermined reference current, whereby storage data can be read out from the MTJ memory cell.

As described above, the electric resistance of tunneling magneto-resistance element TMR is variable in accordance with the magnetization direction, which is rewritable by the data write magnetic field applied thereto. Therefore, nonvolatile data storage can be executed by establishing a correlation of electric resistances Rmax and Rmin of tunneling magneto-resistance element TMR with respect to levels ("1" and "0") of the storage data.

As described above, the MRAM device executes the data storage by utilizing a difference $\Delta R$ ($=Rmax-Rmin$) in junction resistance of tunneling magneto-resistance element TMR corresponding to a difference between storage data levels. Thus, the data read operation is executed based on the detection of passing current Icell of the selected memory cell.

FIG. 22 conceptually shows a conventional data read circuit.

The following description is given on an operation of reading data from memory cells arranged in rows and columns, and particularly from the memory cell storing data of one bit.

Referring to FIG. 22, complementary bit lines are alternately arranged corresponding to memory cell columns. In FIG. 22, the MTJ memory cells are arranged corresponding to each of bit lines BL and /BL, respectively. The above symbol "/" represents inversion, negation, complement or the like in this specification. Each of the MTJ memory cells has a structure similar to that shown in FIG. 18, and has tunneling magneto-resistance element TMR and access element (transistor) ATR connected in series between corresponding bit line BL or /BL and ground voltage GND. Access transistor ATR is connected to corresponding word line WL.

In the following description, one of the two MTJ memory cells, which is connected to bit line BL is merely referred to as "memory cell MC", and the other connected to bit line /BL is referred to as a "reference cell /MC". Memory cell MC and reference cell /MC execute the storing of data of one bit. More specifically, storage data is written into memory cell MC, and data complementary with that in memory cell MC is written into reference cell /MC.

Local data lines LIO and /LIO are arranged for transmitting read data. Local data lines LIO and /LIO form a local data line pair LIOP. In the following description, each of local data lines LIO and /LIO is merely referred to as a "data line". Local data line pair LIOP is merely referred to as a "data line pair LIOP".

The structure is further provided with a data amplifier circuit 90 for amplifying a difference between passing currents, which pass through data lines LIO and /LIO, respectively, and outputting it as data. Data amplifier circuit 90 is activated in response to activation signal SER, and thereby amplifies the passing current difference in the data read operation.

In each memory cell column, column select gate CSG is arranged between the ends on the other side of bit lines BL and /BL and data lines LIO and /LIO. Column select gate CSG is turned on in response to activation ("H" level) of corresponding column select line CSL. Column select line CSL is activated ("H" level) in the selected column during either of the data writing and data reading.

An equalize circuit EQG is provided for each memory cell column. Equalize circuit EQG has a transistor switch 31 connected between corresponding bit lines BL and /BL, a transistor switch 32 connected between bit line BL and ground voltage GND, and a transistor switch 33 connected between bit line /BL and ground voltage GND. Each of transistor switches 31-33 is formed of, e.g., an N-channel MOS transistor.

Each of transistor switches 31-33 receives on its gate a bit line equalize signal BLEQ common to the memory cell column. Bit line equalize signal BLEQ is activated to attain "H" level at least during a predetermined period before the data read operation.

FIG. 23 is a timing chart illustrating an operation of each internal circuit during data reading by the conventional data read circuit system.

Referring to FIG. 23, bit line equalize signal BLEQ is at "H" level, and bit lines BL and BL are in the state precharged to ground voltage GND before start of the data reading at time tA. When the data reading starts at time tA, bit line equalize signal BLEQ attains "L" level, and is isolated or disconnected from ground voltage GND.

At a time tB, word line WL is activated to attain "H" level so that access transistors ATR are turned on to couple electrically bit lines BL and /BL to ground voltage GND. Column select gate CSG is turned on in response to activation ("H" level) of column select line CSL so that data lines LIO and /LIO are electrically coupled to bit lines BL and /BL, respectively.

At a time tC when a period tWL elapses from time tB, an activating signal SER of data amplifier circuit 90 is activated ("L" level) so that a data read current is supplied for starting charging of bit lines BL and /BL and data lines LIO and LIO.

After time tC, a voltage difference allowing detection of a data level does no occur between read data OUT and /OUT until a passing current difference occurs to an extent, which allows detection of the data read current.

By supplying the data read current from data amplifier circuit 90, charging of bit lines BL and /BL and data lines LIO and /LIO is completed at a time tD. After about this time tD, it becomes possible to detect the passing current difference, i.e., the resistance difference based on the storage data of the memory cell MC so that data amplifier circuit 90 produces a voltage difference ΔV. The storage data is read out based on this voltage difference ΔV between read data OUT and /OUT.

As described above, a period of time tBL (between times tC and tD) for charging the bit lines and data lines is required after start of the data reading and before output of the storage data of memory cell MC.

In particular, load capacitances and therefore the charging times of data lines LIO and /LIO generally increase with increase in capacity of the memory array. The charging times of the data lines in the data read operation impair an operation speed of the data reading.

SUMMARY OF THE INVENTION

An object of the invention is to provide a thin film magnetic memory device, which can reduce a charging time of data lines and bit lines required after start of data reading, and can perform fast data reading.

According to an aspect of the invention, a thin film magnetic memory device includes a plurality of memory cells, a word line, first and second data lines and a differential amplifier portion. Each of the plurality of memory cells has an electric resistance corresponding to magnetically written storage data. The word line is activated when the data is to be read from the selected memory cell among the plurality of memory cells. The first data line is electrically coupled to the first voltage via the selected memory cell during the data reading. The second data line is electrically coupled to a first voltage via a reference cell provided as a comparison target of the selected memory cell during the data reading. The differential amplifier portion is activated prior to the word line during the data reading to couple electrically each of the first and second data lines to a second voltage, to start supply of a current to the first and second data lines and to perform data reading in accordance with a difference between currents passing through the first and second data lines, respectively.

Accordingly, the invention can achieve the following major advantage. In the data read operation, the differential amplifier portion is activated before a current path including the data line and the selected memory cell is formed in accordance with activation of the word line, and thereby the differential amplifier electrically couples the second voltage to the data lines to start the charging of the data lines. Since the charging of the data line is completed early, it is possible to reduce a time required from start of the data reading to a time, when the passing current difference between the data lines reaches a level corresponding to the storage data of the selected memory cell, and the data reading can be performed fast.

According to another aspect of the invention, a thin film magnetic memory device includes a plurality of memory cells, a reference cell, first and second data lines, a level control circuit and a data read circuit. Each of the plurality of memory cells has one of first and second electric resistances corresponding to magnetically written storage data. The reference cell has an electric resistance intermediate between the first and second electric resistances. The first data line is electrically coupled between first and second voltages via the selected memory cell corresponding to a selected address among the plurality of memory cells during data reading. The second data line is electrically coupled between the first and second voltages via the reference cell during the data reading. The level control circuit is provided corresponding to the first and second data lines for changing levels of the first and second data lines to predetermined levels during the data reading. The data read circuit performs the data reading in accordance with a difference between passing currents of the first and second data lines.

Since the device according to the invention is provided with the level control circuit for changing voltages on the data lines to the predetermined level during the data reading, a time required for charging the data lines can be reduced, and the data reading can be performed fast.

According to still another aspect of the invention, a thin film magnetic memory device includes a plurality of memory cells, a reference cell, first and second data lines and a data read circuit. The plurality of memory cells are arranged in rows and columns, and each have one of first and second electric resistances corresponding to magnetically written storage data. The reference cell has an electric resistance intermediate between the first and second electric resistances. The first data line is electrically coupled between first and second voltages via the selected memory cell corresponding to a selected address among the plurality of memory cells during data reading. The second data line is electrically coupled between the first and second voltages via the reference cell during the data reading. The data read circuit performs the data reading in accordance with a difference between passing currents of the first and second data lines. Each of the first and second data lines includes bit line portions arranged corresponding to the memory cell columns, respectively, and a local data line portion arranged corresponding to the data read circuit. The thin film magnetic memory device further includes a gate circuit and precharge circuits. The gate circuit controls connection between the bit line portion and the local data line portion in accordance with a column select instruction. The precharge circuits are provided corresponding to the memory cell columns, respectively, for precharging the first and second bit lines before the data reading, and being deactivated in response to the column select instruction during the data reading.

According to the invention, therefore, the precharge circuit for precharging the bit lines is employed, and is deactivated in response to the column select instruction so that a signal line for the precharge circuit is not required. Accordingly, fast data reading can be achieved without increasing the number of parts.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers.

First Embodiment

Figure 1:
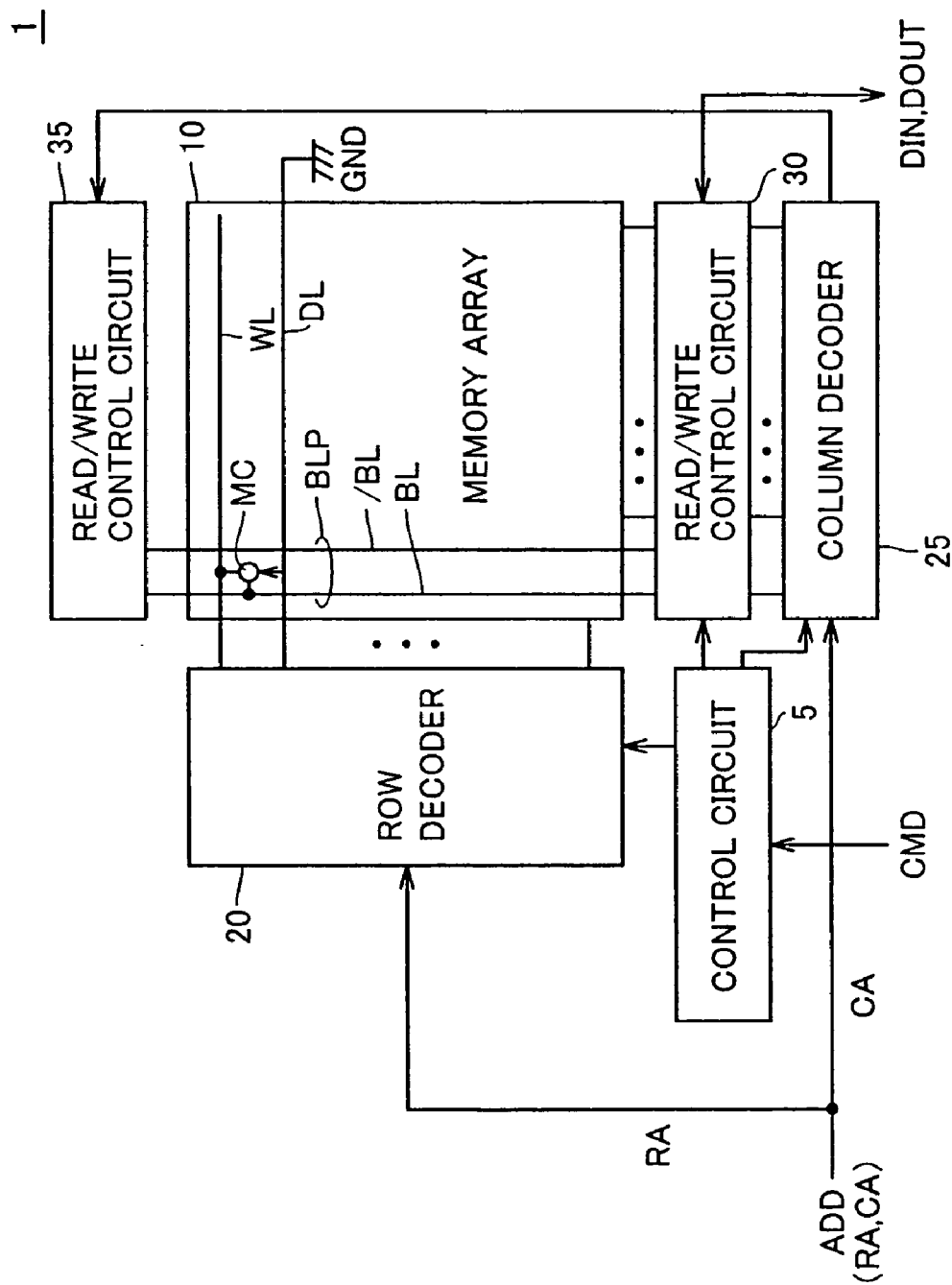
FIG. 1 is a schematic block diagram showing a whole structure of an MRAM device 1 according to an embodiment of the invention.

Referring to FIG. 1, an MRAM device 1 according to a first embodiment of the invention executes random access in response to a control signal CMD and an address signal ADD, which are externally applied, and executes input of write data DIN and output of read data DOUT.

MRAM device 1 includes a control circuit 5 for controlling a whole operation of MRAM device 1 in response to control signal CMD, and a memory array 10 having a plurality of MTJ memory cells MC arranged in rows and columns.

In memory array 10, a word line WL and a digit line DL are arranged corresponding to each row of the MTJ memory cells, and a bit line pair BLP formed of complementary bit lines BL and /BL is arranged corresponding to each column of the MTJ memory cells. FIG. 1 representatively shows one MTJ memory cell MC as well as an arrangement of word line WL, digit line DL and bit line pair BLP provided for MTJ memory cell MC.

MRAM device 1 further includes a row decoder 20, which decodes a row address RA represented by an address signal to execute row selection in memory array 10, a column decoder 25, which decodes a column address CA represented by address signal ADD to execute column selection in memory array 10, and read/write control circuits 30 and 35.

Each of read/write control circuits 30 and 35 is formed of a group of circuits for performing data writing on memory array 10 as well as a group of circuits (which may also be referred to as a "data read circuit system" hereinafter) for reading data from memory array 10.

Digit line DL is coupled to ground voltage GND in a region remote from row decoder 20 with memory array 10 therebetween.

Figure 2:
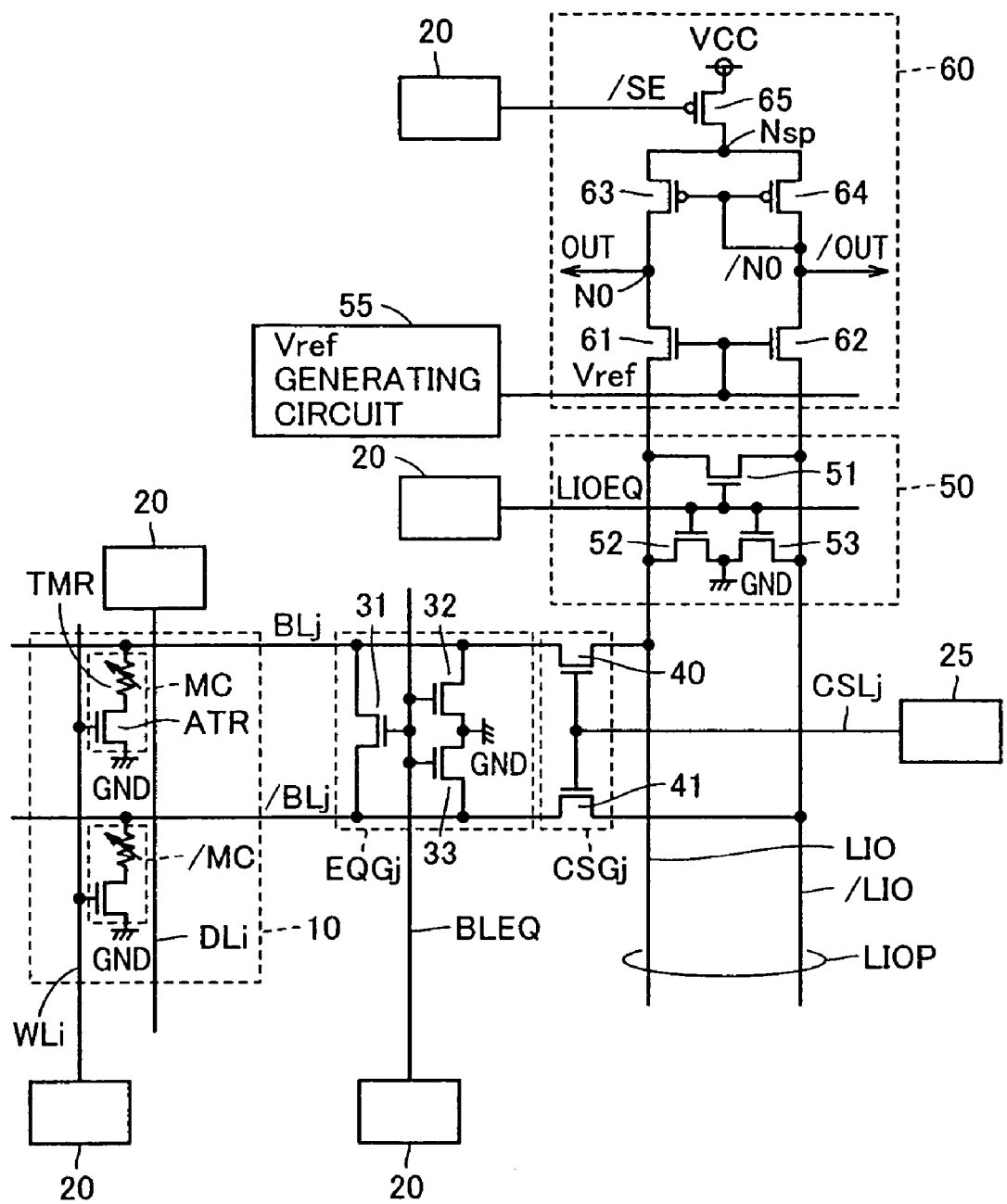
FIG. 2 shows a structure of a data read circuit system according to a first embodiment of the invention.

Referring to FIG. 2, description will now be given on structure of the data read circuit system according to the first embodiment of the invention.

Figure 18:
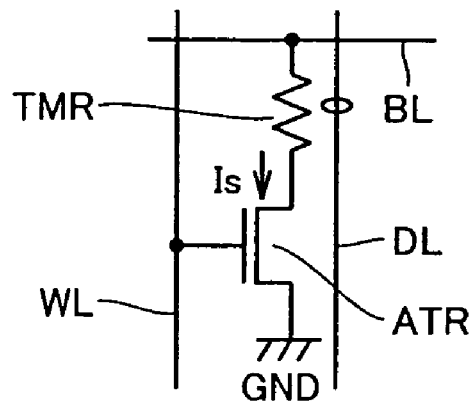
FIG. 18 shows a structure of a memory cell having a magnetic tunnel junction.
Figure 19:
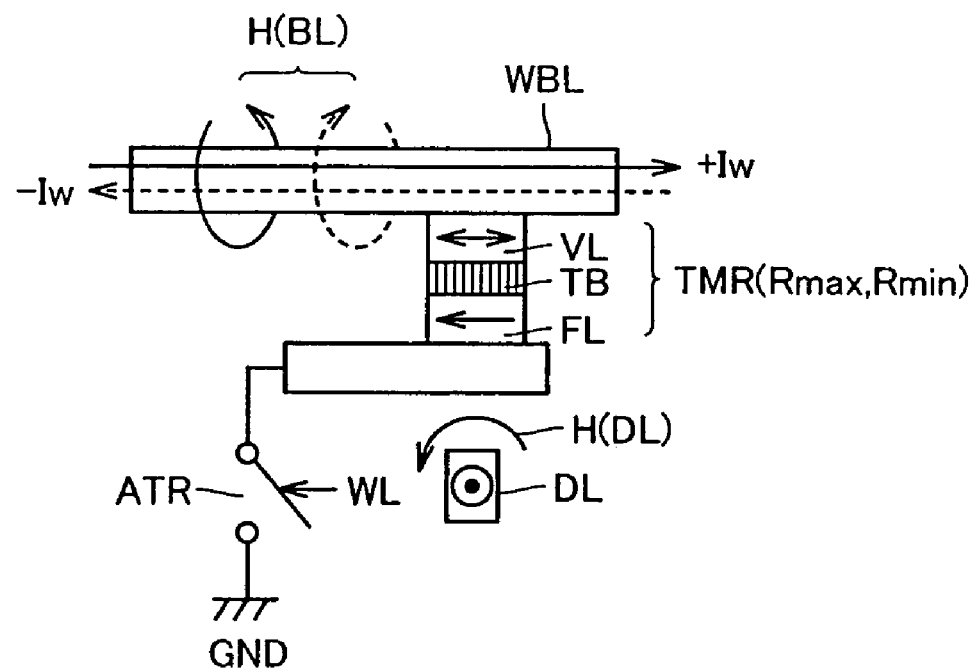
FIG. 19 conceptually illustrates an operation of writing data into a MTJ memory cell.
Figure 20:
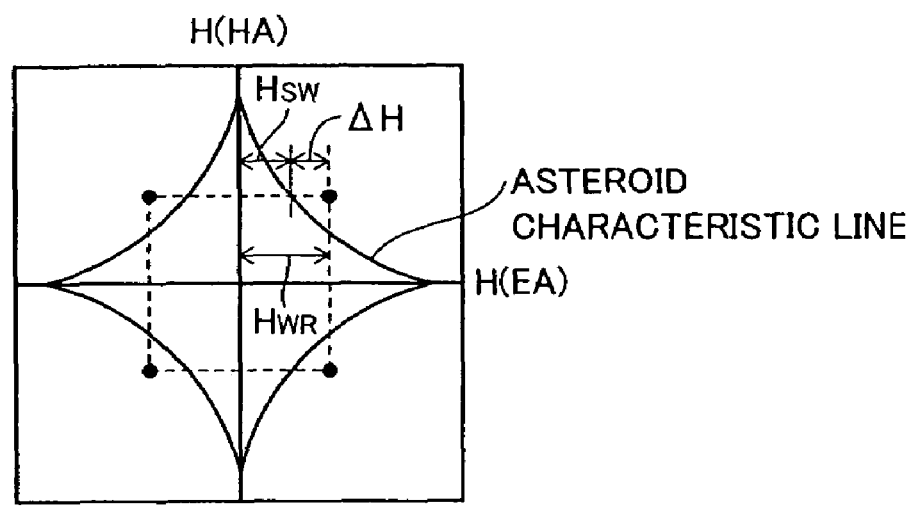
FIG. 20 conceptually illustrates a relationship between data write currents and a magnetization direction of a tunneling magneto-resistance element during data writing.
Figure 21:
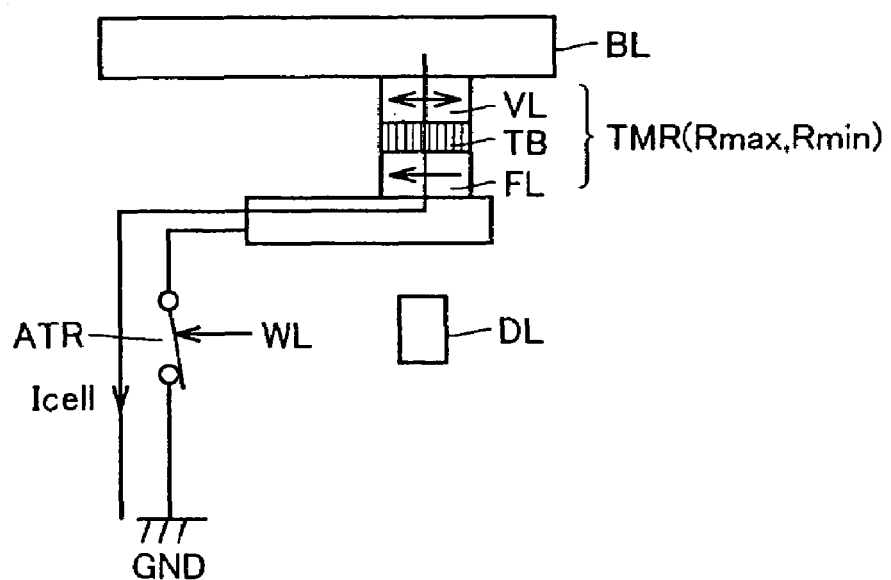
FIG. 21 conceptually illustrates data reading from a MTJ memory cell.

Memory array 10 has MTJ memory cells, which are arranged at crossings of word lines WL and bit lines BL and /BL, respectively. Thus, the two MTJ memory cells are arranged corresponding to one address indicated by a combination of the row and column addresses. Each of the MTJ memory cells has a structure similar to that shown in FIG. 18, and has a tunneling magneto-resistance element TMR and an access element (access transistor) ATR, which are connected in series between corresponding bit line BL or BL and ground voltage GND. Access transistor ATR has a gate connected to corresponding word line WL.

FIG. 2 representatively shows word line WLi, digit line DLi and bit lines BLj and /BLj corresponding to a memory cell row in an ith (i: natural number) position and a memory cell column in a jth (j: natural number) position as well as corresponding memory cell MC and a reference cell /MC.

In the following description, binary voltage states, i.e., a high voltage state (e.g., power supply voltage VCC) and a low voltage state (e.g., ground voltage GND) of signals, signal lines, data and others may also be referred to as ""H" level" and ""L" level", respectively.

At the vicinity of memory array 10, complementary data lines LIO and /LIO are arranged for transmitting the read data and the write data. Data lines LIO and /LIO form a data line pair LIOP.

Figure 22:
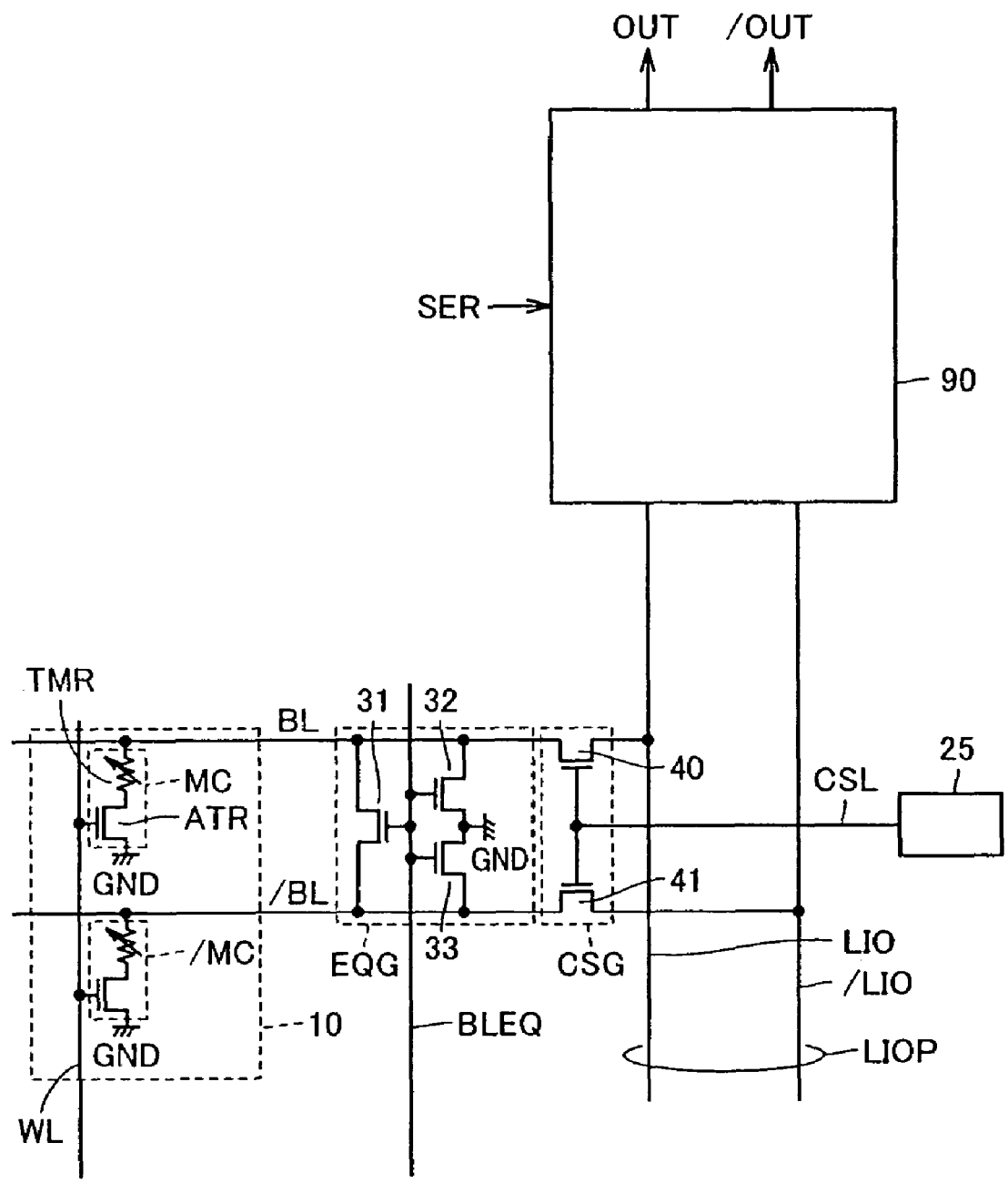
FIG. 22 conceptually shows a conventional data read circuit system.

In each memory cell column, a column select gate CSG is arranged between the ends on the other side of bit lines BL and /BL and data lines LIO and /LIO. Column select gate CSG is turned on in response to activation ("H" level) of corresponding column select line CSL. Column select line CSL in the selected column is activated ("H" level) in both the data write operation and the data read operation. FIG. 2 representatively shows column select line CSLj and column select gate CSGj provided corresponding to bit lines BLj and /BLj. Column select gate CSGj has substantially the same structure as the column select gate shown in FIG. 22.

Description will now be given on an operation of reading data from the MTJ memory cell.

Read/write control circuit 30 has equalize circuits EQG arranged for the memory cell columns, respectively. FIG. 2 representatively shows equalize circuit EQGj corresponding to the memory cell column in the jth position. Equalize circuit EQGj has substantially the same structure as the equalize circuit shown in FIG. 22.

Read/write control circuit 30 further has a data line equalize circuit 50 for equalizing data line pair LIOP and a differential amplifier 60.

Data line equalize circuit 50 has a-transistor switch 51 connected between data lines LIO and /LIO, a transistor switch 52 connected between data line LIO and ground voltage GND, and a transistor switch 53 connected between data line /LIO and ground voltage GND. Each of transistor switches 51, 52 and 53 is formed of, e.g., an N-channel MOS transistor.

Each of transistor switches 51, 52 and 53 receives on its gate a data line equalize signal LIOEQ produced by row decoder 20. Data line equalize signal LIOEQ is activated to attain "H" level at least for a predetermined period before the data read operation. By the precharge/equalize operation in response to this activation, each of data lines LIO and /LIO is set to ground voltage GND.

Differential amplifier 60 has an N-channel MOS transistor 61 connected between a node N0 and data line LIO, an N-channel MOS transistor 62 connected between a node /N0 and data line /LIO, a P-channel MOS transistor 63 connected between nodes Nsp and N0, a P-channel MOS transistor 64 connected between nodes Nsp and /N0, and a P-channel MOS transistor 65 connected between power supply voltage VCC and node Nsp.

Each of gates of transistors 63 and 64 is connected to node /N0. Transistors 63 and 64 form a current mirror circuit, and tend to supply the same current to nodes N0 and /N0.

Each of gates of transistors 61 and 62 is supplied with a fixed reference voltage Vref produced by a Vref generating circuit 55. Transistors 61 and 62 maintain data lines LIO and /LIO at or below the reference voltage, and amplify a difference between passing currents of data lines LIO and /LIO to convert it into a voltage difference between nodes N0 and /N0.

Transistor 65 receives on its gate a sense enable signal /SE, which is activated to attain "L" level by row decoder 20 in the data read operation. Transistor 65 supplies an operation current to operate differential amplifier 60 in response to activation ("L" level) of sense enable signal /SE.

Figure 3:
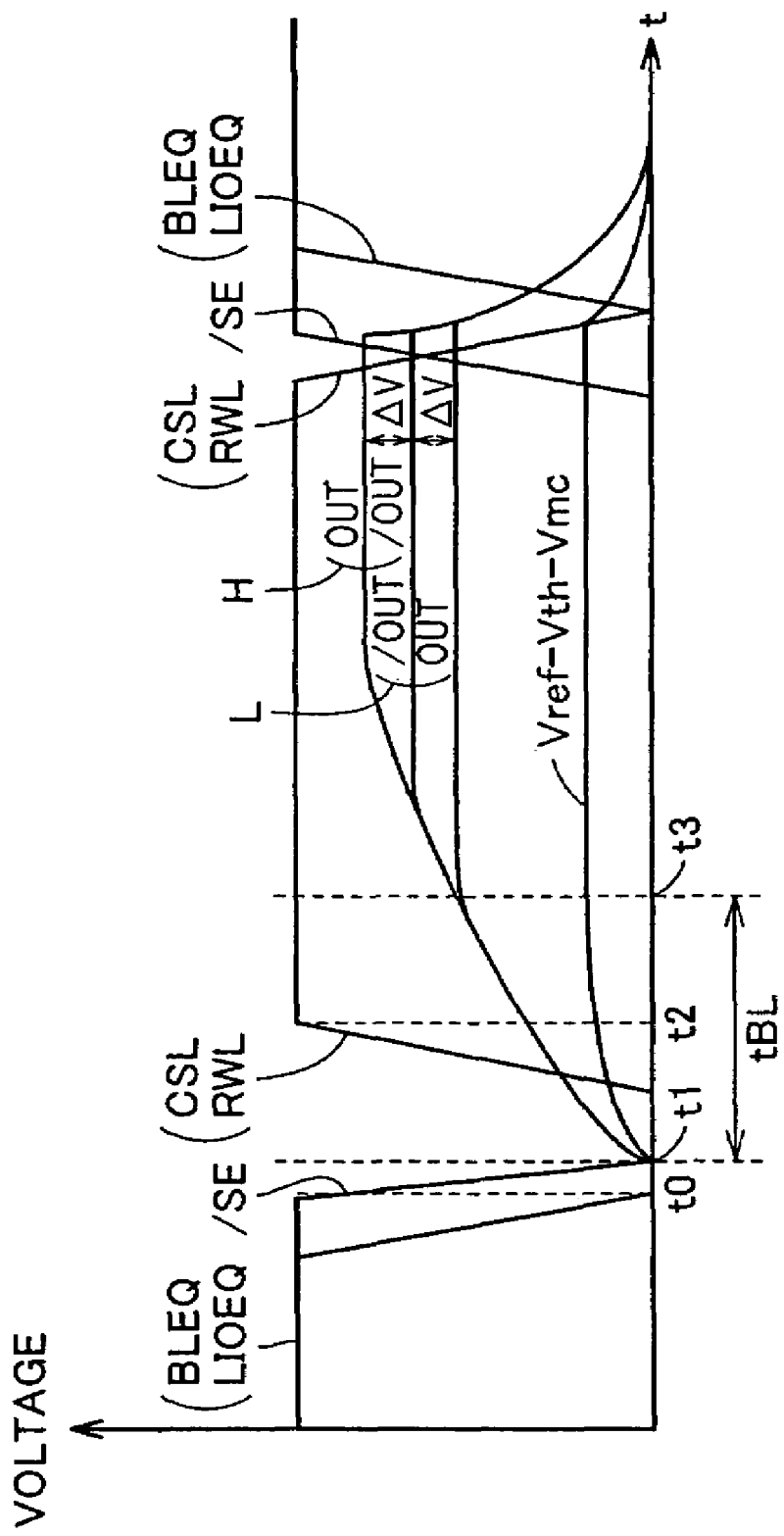
FIG. 3 is a timing chart illustrating a data read operation in the MRAM device according to the first embodiment.

Referring to FIG. 3, description will now be given on the data read operation in the MRAM device according to the first embodiment.

FIG. 3 represents by way of example the operation in the case where the ith row and the jth column are selected as the data read target.

Referring to FIG. 3, data line equalize signal LIOEQ and bit line equalize signal BLEQ are active and at "H" level before a time t0 of start of the data read operation. Thereby, bit lines BL and /BL in each memory cell column are precharged to ground voltage GND, and data lines LIO and /LIO are precharged to ground voltage GND.

When the data read operation starts at time t0, data line equalize signal LIOEQ and bit line equalize signal BLEQ are first deactivated to attain "L" level so that each of bit lines BL and /BL and data lines LIO and /LIO is disconnected from ground voltage GND. Time t0 corresponds to time tA in FIG. 23.

At a time t1, sense enable signal /SE is activated to attain "L" level so that differential amplifier 60 is activated. Thereby, charging of each of data lines LIO and /LIO starts.

At a subsequent time t2, word line WLi in the selected row and column select line CSLj in the selected column are activated to attain "H" level. According to the first embodiment, as described above, sense enable signal SE is activated earlier than column select line CSL and word line WL. Time t2 corresponds to time tB in FIG. 23.

In response to the activation of word line WLi in the selected row and column select line CSLj in the selected column, data line LIO is pulled down to ground voltage GND through bit line BLj and memory cell MC, and data line /LIO is pulled down to ground voltage GND through bit line /BLj and reference cell /MC. As already described, complementary data are written in memory cell MC and reference cell /MC, and therefore memory cell MC and reference cell /MC have one and the other of electric resistances Rmax and Rmin, respectively.

In response to the activation of sense enable signal /SE, transistor 65 supplies the operation current, which flows. to ground voltage GND through data lines LIO and /LIO, bit lines BLj and /BLj, and tunneling magneto-resistance elements TMR of memory cell MC and reference cell /MC.

In differential amplifier 60, the current mirror circuit formed of transistors 63 and 64 tends to supply the same current to data lines LIO and /LIO. However, an electric resistance difference ΔR is present between memory cell MC and reference cell /MC corresponding to the selected address so that a current difference tends to occur between the passing currents of them. This current difference tends to cause a voltage difference between bit lines BLj and /BLj, and thus between data lines LIO and /LIO. This voltage difference corresponds to a difference in source/drain voltage between transistors 61 and 62 in differential amplifier 60 so that the electric resistance difference ΔR is converted into a difference in passing current (source/drain current) between transistors 61 and 62. Thus, current difference appears as the current difference between bit lines BLj and /BLj, and between data lines LIO and /LIO. Transistors 61 and 62 cause a voltage difference ΔV, which is produced by amplifying the current difference, between nodes N0 and /N0. The polarity of voltage difference ΔV, i.e., a relative magnitude in voltage between nodes N0 and /N0 depends on the storage data of selected memory cell MC. As shown in FIG. 3, a voltage difference occurs between data signals OUT and /OUT applied from nodes N0 and /N0 of differential amplifier 60, and the read data corresponding to "H" or "L" level of the storage data is output in response to this voltage difference.

In this embodiment, since sense enable signal /SE is activated ("L" level) earlier than column select line CSL and word line WL, charging of data lines LIO and /LIO can start before activation of column select line CSL and word line WL.

Figure 23:
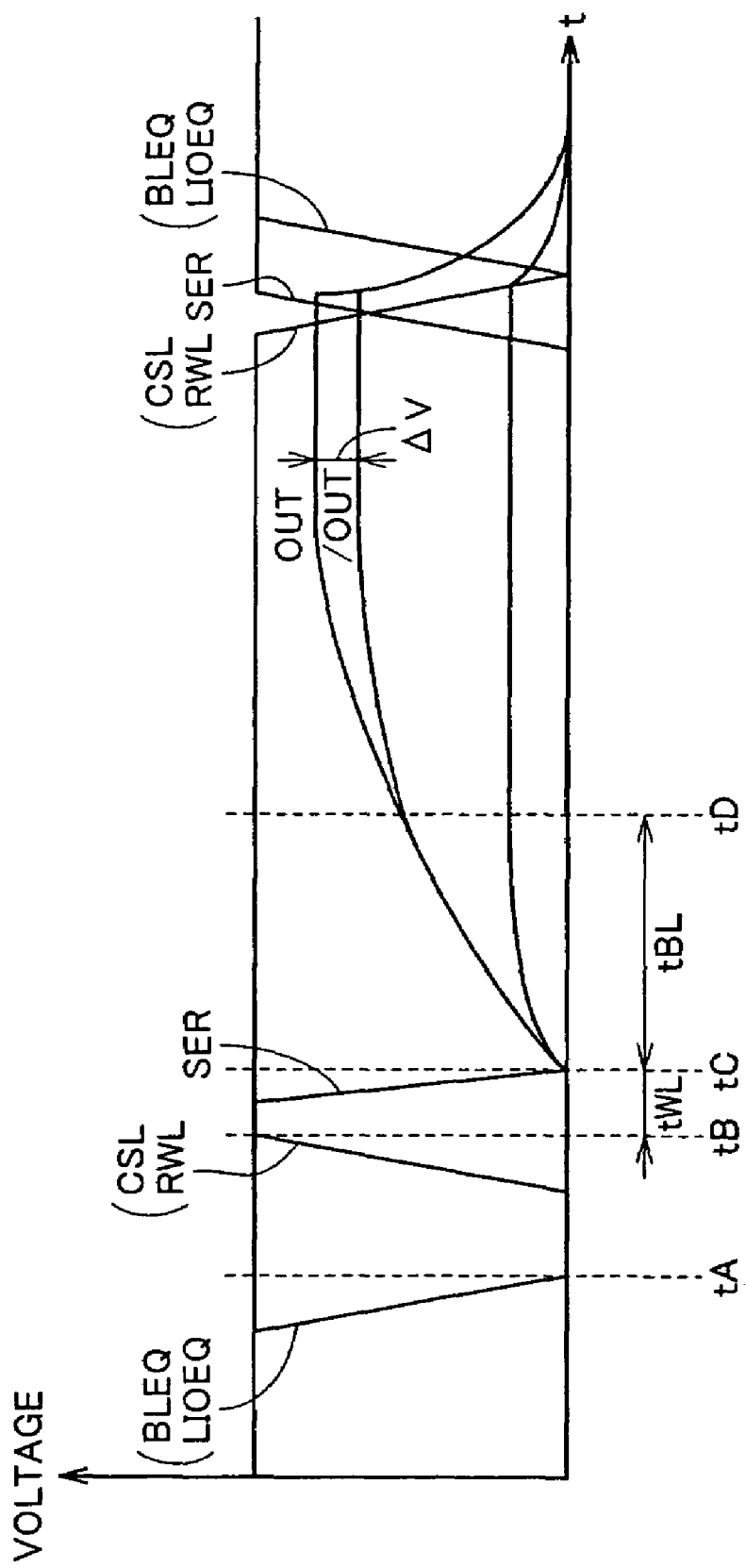
FIG. 23 is a timing chart illustrating data reading of the conventional data read circuit system.

More specifically, a charging time tBL between times t1 and t3, i.e., from activation ("L" level) of sense enable signal SE to charging of the bit line and data line is substantially the same as the charging time in the prior art already described with reference to FIG. 23. However, a period tWL required before starting supply of the current as shown in FIG. 23 can be eliminated so that the time required for the data reading can be reduced.

A voltage difference does not occur between charged bit lines BLj and /BLj, and between charged data lines LIO and /LIO, and each of voltages on data lines LIO and /LIO as well as bit lines BLj and /BLj is stably kept at "Vref−Vth−Vmc", where Vth corresponds to a threshold voltage of transistors 61 and 62, and Vmc corresponds to a voltage drop caused in memory cell MC and reference cell /MC.

Reference voltage Vref is determined in view of, e.g., reliability of an insulating film, which is a tunneling barrier in the tunneling magneto-resistance element, so that the foregoing voltage "Vref–Vth–Vmc" is equal to, e.g., about 400 mV. This avoids breakdown of the memory cell due to application of an excessive voltage, and can improve operation reliability.

According to the structure of the first embodiment, as already described, sense enable signal /SE is activated ("L" level) before execution of the row and column selecting operations, and differential amplifier 60 starts the charging of data lines LIO and /LIO in advance. Thereby, it is possible to reduce a period from start of the data read operation to the data reading, and the data read operation can be performed fast.

Second Embodiment

A second embodiment of the invention is aimed at suppression of an imbalance between capacitances of bit line pair BLP and data line pair LIOP, which may occur due to variations in respective elements during manufacturing.

Figure 4:
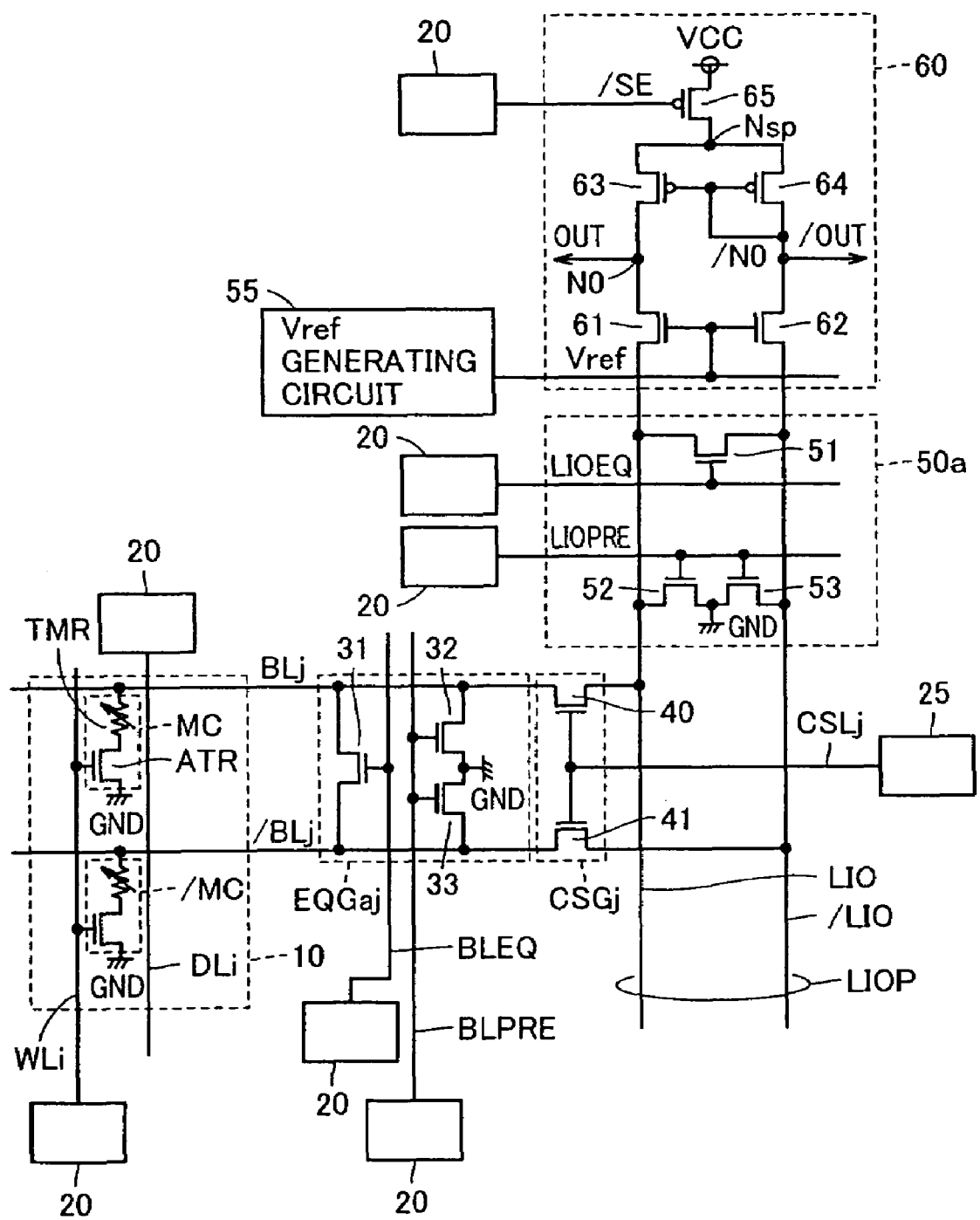
FIG. 4 shows a structure of a data read circuit system according to a second embodiment.

Referring to FIG. 4, a structure of a data read circuit system according to a second embodiment differs from the structure shown in FIG. 2 in that a data line equalize circuit 50a is arranged in place of data line equalize circuit 50, and an equalize circuit EQGaj is arranged in place of equalize circuit EQGj.

Equalize circuit EQGaj differs from equalize circuit EQGj shown in FIG. 2 in that transistor switch 31 for equalizing is controlled independently of transistor switches 32 and 33 for precharging. More specifically, transistor switch 31 receives bit line equalize signal BLEQ on its gate, and transistors 32 and 33 both receive a bit line precharge signal BLPRE on their gates. Bit line precharge signal BLPRE is produced by row decoder 20.

Data line equalize circuit 50a differs from data line equalize circuit 50 shown in FIG. 2 in that transistor switch 51 used for equalizing is controlled independently of transistor switches 52 and 53 used for precharging. More specifically, transistor switch 51 receives data line equalize signal LIOEQ on its gate, and transistors 52 and 53 both receive data line precharge signal LIOPRE on their gates. Data line precharge signal LIOPRE is produced by row decoder 20.

Structures of the MRAM device of the second embodiment other than the above are substantially the same as those of the first embodiment, and therefore description thereof is not repeated.

Figure 5:
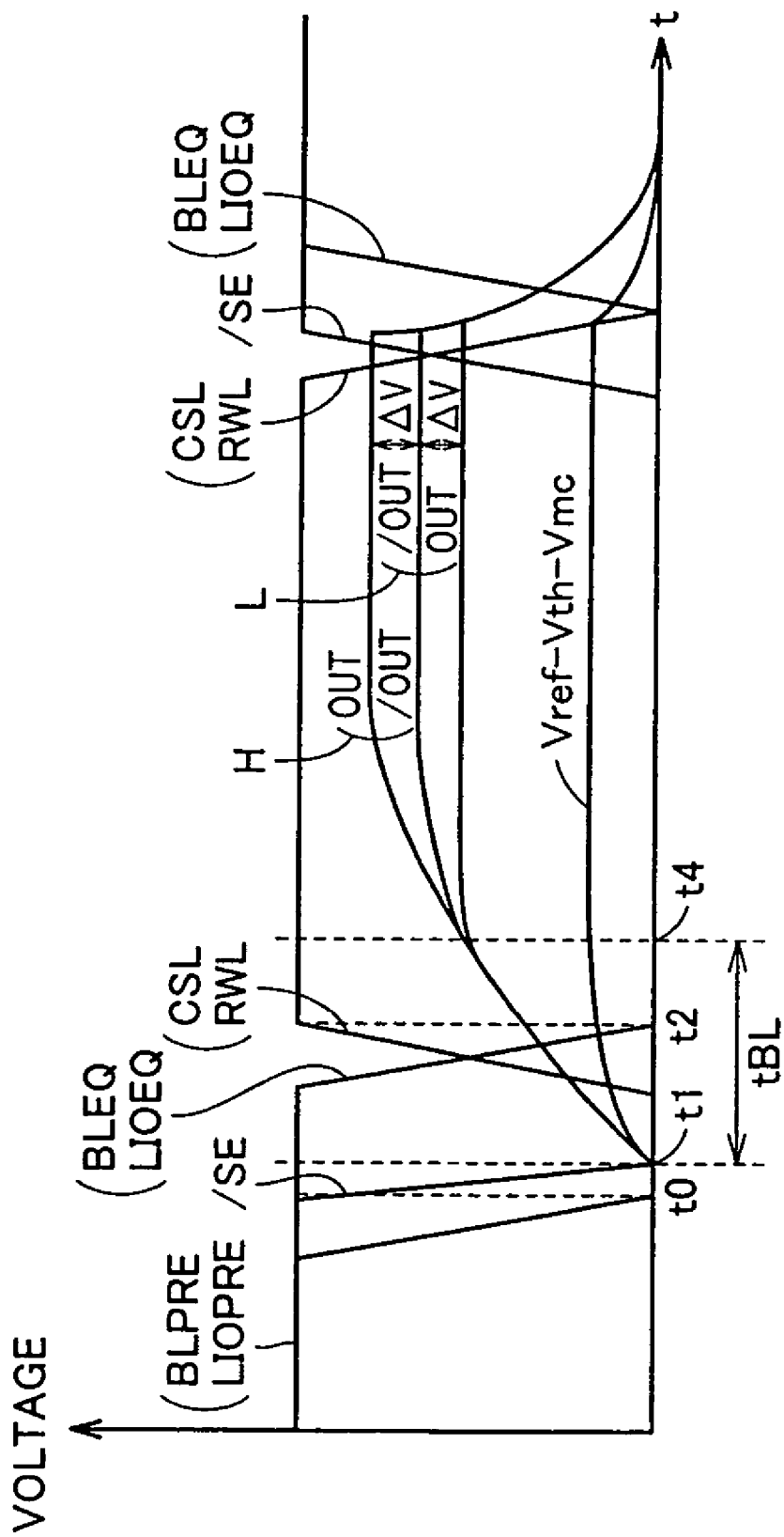
FIG. 5 is a timing chart illustrating a data read operation of an MRAM device according to the second embodiment.

Referring to FIG. 5, description will now be given on the data read operation in the MRAM device according to the second embodiment. FIG. 5 representatively illustrates the operation to be performed when the ith row and the jth column are selected as the data read target.

Referring to FIG. 5, bit line equalize signal BLEQ, data line equalize signal LIOEQ, bit line precharge signal BLPRE and data line precharge signal LIOPRE are active and at "H" level before time t0 of start of the data read operation. Therefore, bit lines BL and /BL in each memory cell column as well as data lines LIO and /LIO are electrically coupled to ground voltage GND. The paired bit lines as well as the paired data lines are electrically coupled together, and thereby are equalized.

At time t0 of start of the data reading, bit and data line precharge signals BLPRE and LIOPRE are at "L" level, and bit lines BL and /BL as well as data lines LIO and /LIO are electrically isolated from ground voltage GND.

At time t1, sense enable signal /SE is activated to attain "L" level so that differential amplifier 60 starts the operation. Thereby, charging of each of data lines LIO and /LIO with power supply voltage VCC starts. At this point in time, data lines LIO and /LIO are electrically connected by transistor 51, and therefore will be charged to keep an equal potential.

In response to the activation of word line WLi in the selected row and column select line CSLj in the selected column at time t2, data line LIO is pulled down to ground voltage GND through bit line BLj and memory cell MC, and data line /LIO is pulled down to ground voltage GND through bit line /BLj and reference cell /MC.

In accordance with the same timing as the above, bit and data line equalize signals BLEQ and LIOEQ attain "L" level, and each of the bit lines and data lines is electrically isolated.

At a time t4, the bit lines and data lines are charged, and a current difference similar to that in the first embodiment, i.e., the current difference corresponding to electric resistance difference $\Delta R$ between memory cell MC and reference cell /MC in the selected address occurs between bit lines BLj and /BLj as well as between data lines LIO and /LIO. This current difference is converted into voltage level difference $\Delta V$ between nodes N0 and /N0 by transistors 61 and 62 similarly to the first embodiment.

However, a voltage difference does not occur between bit lines BLj and /BLj as well as between data lines LIO and /LIO, and the voltage of "Vref–Vth–Vmc" is stably kept on each of these lines similarly to FIG. 3.

As described above, data line equalize signal LIOEQ is still active even after start of the operation of differential amplifier 60, and the complementary data lines are electrically coupled together so that an imbalance between the load capacitances can be adjusted. Thus, charging times of data lines LIO and /LIO can be averaged.

Accordingly, such a problem can be avoided that a large imbalance is present between load capacitances of the complementarily data lines, and the charging time of one of the data lines is longer than that of the other data line so that an imbalance occurs between the charging times, and a delay occurs in data reading. Consequently, data reading can be performed fast and stably. According to the structure of the second embodiment, even if a large imbalance is present between load capacitances of the complementary data lines due to variations during manufacturing of the elements, this imbalance is adjusted by electrically coupling the complementary data lines for a predetermined period, and the data reading can be executed more stably and rapidly than the first embodiment.

Description has been given on the structure, in which bit line equalize signal BLEQ and data line equalize signal LIOEQ are set to "L" level in accordance with substantially the same timing as the activation ("H" level) of word line WL and column select line CSL. However, this is not restrictive, and bit line equalize signal BLEQ and data line equalize signal LIOEQ can be set to "L" level upon elapsing of a predetermined period after the activation of word line WL and column select line CSL.

Third Embodiment

A third embodiment will now be described in connection with a structure, in which a predetermined voltage is used as a precharge voltage in stead of ground voltage GND.

Figure 6:
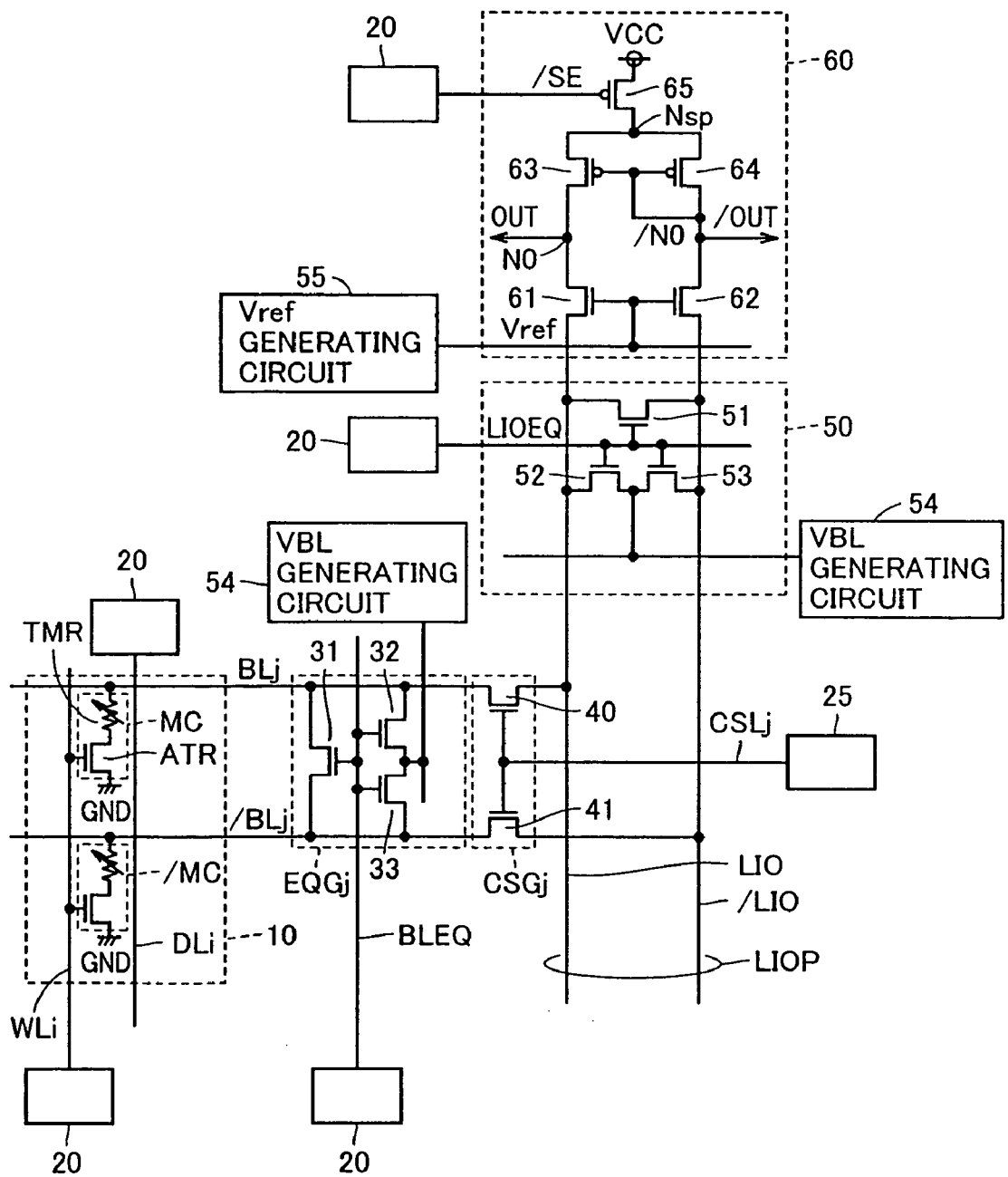
FIG. 6 is a circuit diagram showing a structure of a data read circuit system according to a third embodiment.

Referring to FIG. 6, a structure of a data read circuit system according to the third embodiment differs from the structure shown in FIG. 2 in that a predetermined voltage VBL produced by a VBL generating circuit 54 is used as the precharge voltage to be supplied to equalize circuit EQGj instead of ground voltage GND. Further, predetermined voltage VBL is used as the precharge voltage to be supplied to data line equalize circuit 50 instead of ground voltage GND. Predetermined voltage VBL is set to a level corresponding to "Vref−Vth−Vmc" already described.

Figure 7:
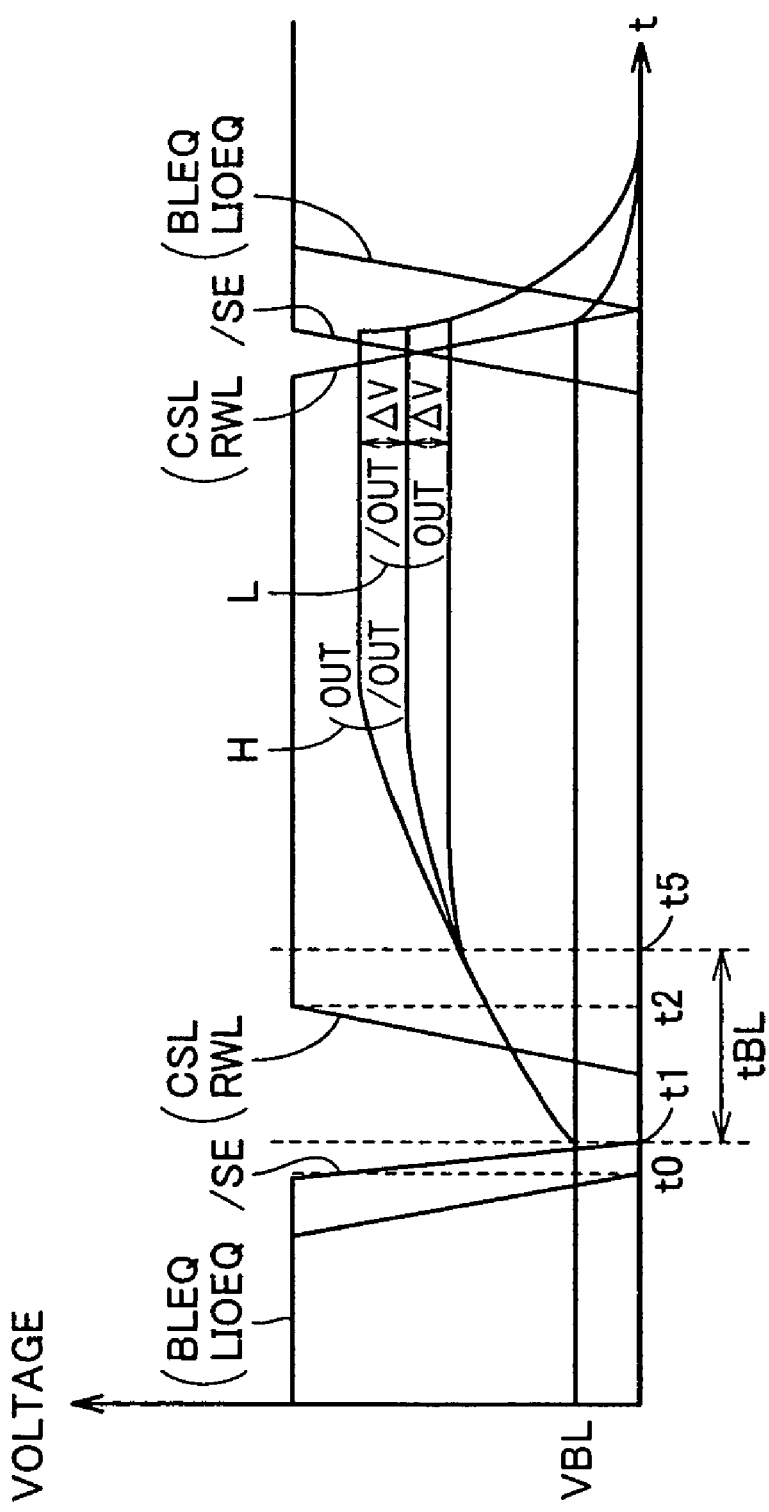
FIG. 7 is a timing chart illustrating a data read operation of an MRAM device according to the third embodiment.

Referring to FIG. 7, description will now be given on the data read operation in the MRAM device according to the third embodiment. FIG. 7 representatively illustrates the operation to be performed when the ith row and the jth column are selected as the data read target.

Referring to FIG. 7, bit and data line equalize signals BLEQ and LIOEQ are active and at "H" level before time t0 of start of the data read operation. Therefore, bit lines BL and /BL in each memory cell column and data lines LIO and /LIO are precharged to predetermined voltage VBL. The paired bit lines as well as the paired data lines are electrically coupled, and thereby are equalized.

At time t0, bit and data line equalize signals BLEQ and LIOEQ are at "L" level, and bit lines BL and /BL as well as data lines LIO and /LIO are electrically isolated from predetermined voltage VBL.

At time t1, sense enable signal /SE is activated to attain "L" level so that differential amplifier 60 starts the operation. Thereby, charging of data lines LIO and /LIO with power supply voltage VCC starts.

Subsequent operations are substantially the same as those in the first embodiment already described, and therefore description thereof is not repeated.

According to the third embodiment, the bit lines and data lines are already precharged to the level of predetermined voltage VBL when differential amplifier 60 starts the operation. Accordingly, at a time t5 immediately after activation of word line WL and column select line CSL, a current difference, which is similarly to that in the first embodiment and corresponds to electric resistance difference ΔR between memory cell MC and reference cell /MC in the selected address, occurs between bit lines BLj and /BLj as well as between data lines LIO and /LIO. In response to this, conversion into voltage level difference ΔV between nodes N0 and /N0 is performed.

According to the structure of the third embodiment, the bit lines and data lines are precharged with predetermined voltage VBL generated by VBL generating circuit 54 so that the charging time of the bit lines and data lines is further reduced, and the data reading from the MRAM device can be performed further fast.

Modification of the Third Embodiment

A modification of the third embodiment is aimed at suppression of an imbalance between capacitances of bit line pair BLP and data line pair LIOP, which may occur due to variations in respective elements during manufacturing.

Figure 8:
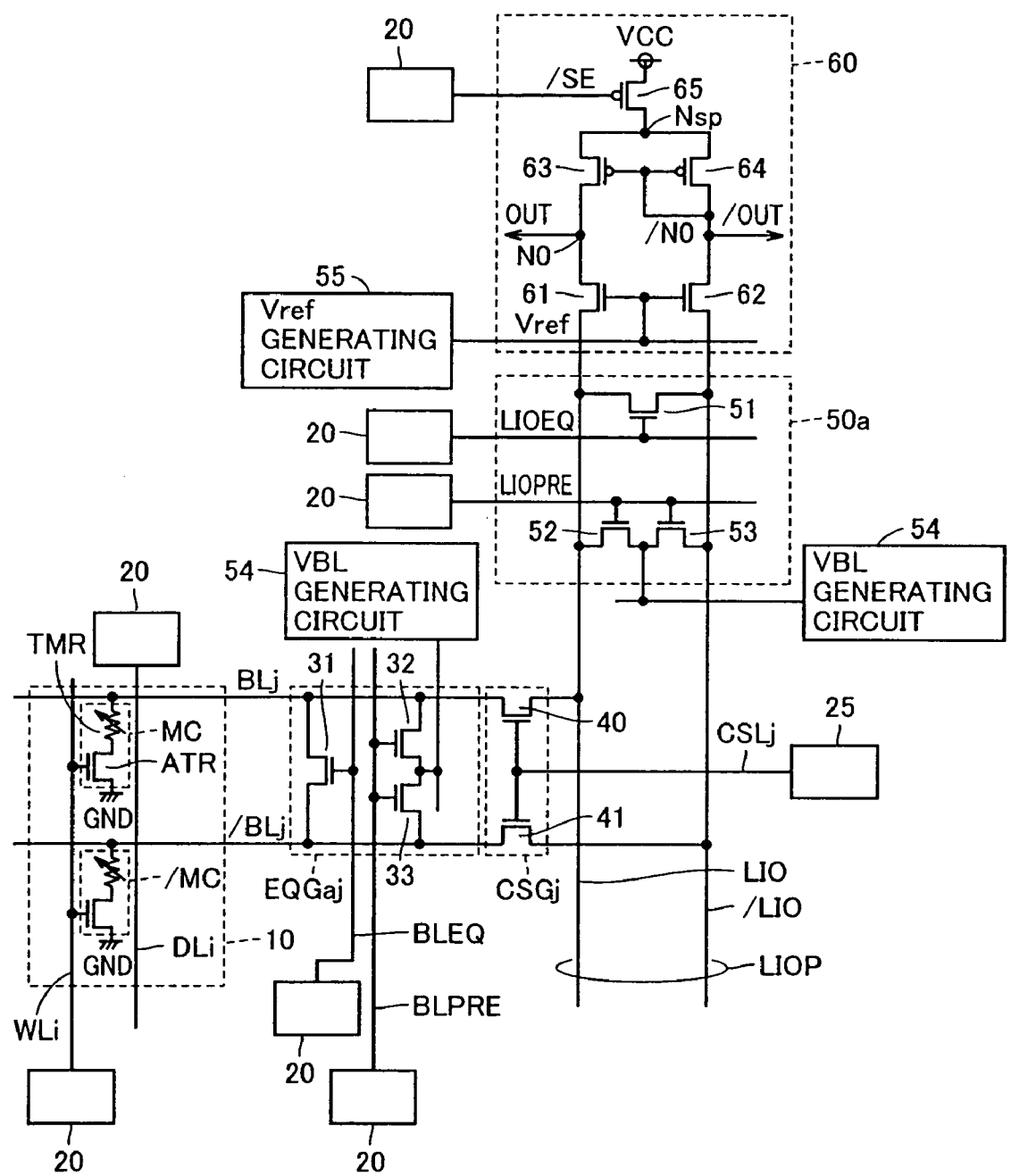
FIG. 8 is a circuit diagram showing a structure of a data read circuit system according to a modification of the third embodiment.

Referring to FIG. 8, a structure of a data read circuit system according to the modification of the third embodiment differs from the structure of the second embodiment in that predetermined voltage VBL produced by VBL generating circuit 54 is used as the precharge voltage to be supplied to equalize circuit EQGaj instead of ground voltage GND. Further, predetermined voltage VBL is used as the precharge voltage to be supplied to data line equalize circuit 50a instead of ground voltage GND. Structures other than the above are substantially the same as those of the second embodiment, and therefore description thereof is not repeated.

Figure 9:
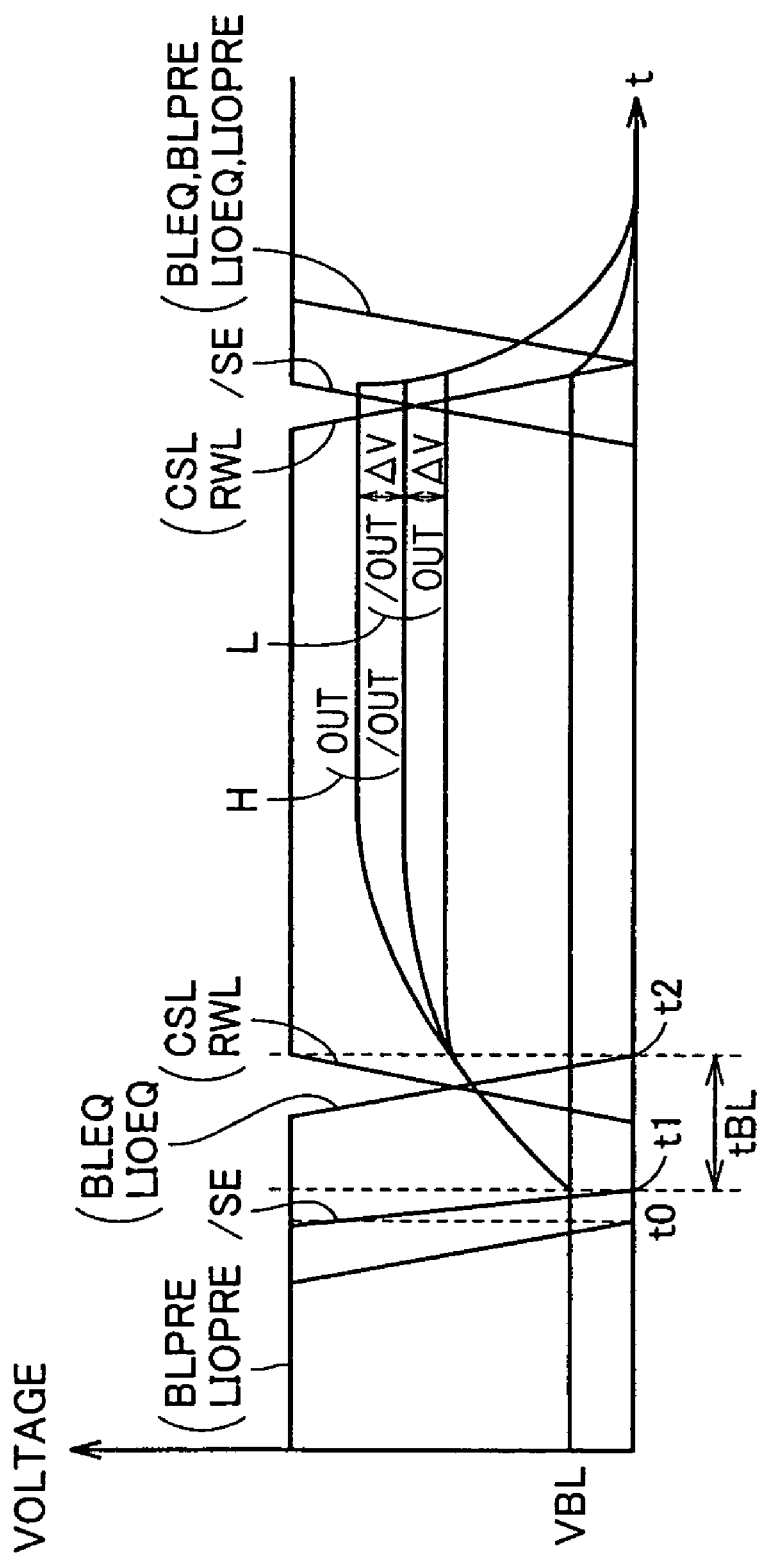
FIG. 9 is a timing chart illustrating a data read operation of an MRAM device according to the modification of the third embodiment.

Referring to FIG. 9, description will now be given on the data read operation in the MRAM device according to the modification of the third embodiment. FIG. 9 representatively illustrates the operation to be performed when the ith row and the jth column are selected as the data read target.

Referring to FIG. 9, bit and data line equalize signals BLEQ and LIOEQ as well as bit and data line precharge signals BLPRE and LIOPRE are active and at "H" level before time t0 of start of the data read operation. Therefore, bit lines BL and /BL in each memory cell column and data lines LIO and /LIO are precharged to predetermined voltage VBL. The paired bit lines as well as the paired data lines are electrically coupled and equalized.

At time t0, bit and data line precharge signals BLPRE and LIOPRE attain at "L" level to end the precharge, and the data read operation starts.

At time t1, sense enable signal /SE is activated to attain "L" level so that differential amplifier 60 starts the operation. Thereby, charging of data lines LIO and /LIO with power supply voltage VCC starts. At this point in time, data lines LIO and /LIO are electrically connected by transistor 51, and therefore will be charged to keep an equal potential.

Subsequent operations are substantially the same as those in the second embodiment already described, and therefore description thereof is not repeated.

According to the modification of the third embodiment, the bit lines and data lines are already precharged to the level of predetermined voltage VBL when differential amplifier 60 starts the operation. Accordingly, at a time similar to time t2, when bit and data line equalize signals BLEQ and LIOEQ attain "L" level after activation of word line WL and column select line CSL, a current difference, which is similarly to the first embodiment and corresponds to electric resistance difference ΔR between memory cell MC and reference cell /MC in the selected address, occurs between bit lines BLj and /BLj as well as between data lines LIO and /LIO. In response to this, the difference is converted into voltage level difference ΔV between nodes N0 and /N0.

As described above, the bit lines and data lines are already charged to the level of predetermined voltage VBL when differential amplifier 60 starts the operation. Therefore, the charging time of the bit lines and data lines can be further reduced.

According to the structure of the modification of the third embodiment, even if a large imbalance is present between the load capacitances of complementary data lines due to variations during manufacturing of the elements forming the data read circuit system, this imbalance between the load capacitances is adjusted by activating data line equalize signal LIOEQ even after start of the operation of differential amplifier 60, and thereby mutually and electrically coupling the complementary data lines. Thus, the charging times of data lines LIO and /LIO can be averaged. Therefore, the data reading from the MRAM device can be executed more stably and rapidly than the third embodiment.

Description has been given on the structure, in which bit and data line equalize signals BLEQ and LIOEQ are set to "L" level in substantially the same timing as the activation ("H" level) of word line WL and column select line CSL. However, this is not restrictive, and bit and data line equalize signals BLEQ and LIOEQ can be set to "L" level after the activation of word line WL and column select line CSL.

Fourth Embodiment

A fourth embodiment will now be described in connection with a structure of VBL generating circuit 54 used in the third embodiment and the modification thereof.

The fourth embodiment of the invention is aimed at production of intended voltage VBL by providing the circuit, which forms a current path equivalent to the data read circuit system.

Figure 10:
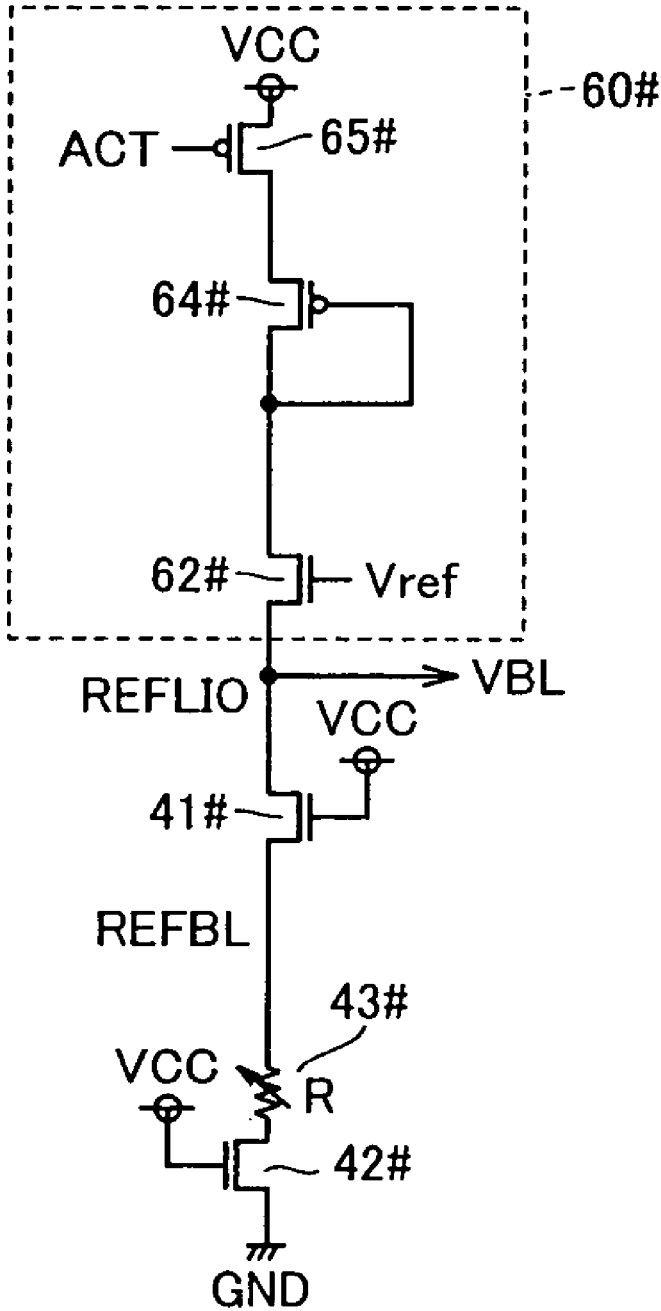
FIG. 10 is a circuit diagram showing a structure of a VBL generating circuit according to a fourth embodiment.

Referring to FIG. 10, VBL generating circuit 54 according to the fourth embodiment includes a sense equivalent circuit 60#, transistors 41# and 42#, and a resistance element 43#, which are connected in series. Transistor 41# has substantially the same design and transistor characteristics as transistor 41. Transistor 42# has a design falsely corresponding to access transistor ATR of the memory cell, and has substantially the same transistor characteristics as access transistor ATR. Resistance element 43# has a design falsely corresponding to tunneling magneto-resistance element TMR of the memory cell, and has substantially the same resistance element characteristics as tunneling magneto-resistance element TMR. Resistance element 43# can have a resistance value, which is set within a predetermined range between maximum and minimum values Rmax and Rmin of the electric resistance of the resistance element characteristics of tunneling magneto-resistance element TMR.

Sense equivalent circuit 60# includes transistors 65#, 64# and 62# connected in series to power supply voltage VCC. Transistor 65# has transistor characteristics designed similarly to transistor 65 included in differential amplifier 60, and is turned on in response to an activating signal ACT. Transistor 64# has transistor characteristics designed similarly to transistor 64. A gate of transistor 64# is connected to its drain side. Transistor 62# has transistor characteristics designed similarly to transistor 62, and is turned on when it receives reference voltage Vref. VBL generating circuit 54 receives activating signal ACT in the data read operation, and thereby turns on transistor 65# to output voltage VBL from a node REFLIO. Alternatively, it may output voltage VBL from node REFBL. Transistor 41#, which is arranged between nodes REFLIO and REFBL, receives a high voltage, i.e., power supply voltage VCC, and is on so that the voltage levels on nodes REFLIO and REFBL are substantially equal to each other.

In FIG. 10, voltage VBL is set to "Vref−Vth−Vmc", where Vth corresponds to a threshold voltage of transistor 62#, and Vmc corresponds to a voltage drop caused by resistance element 43#.

More specifically, VBL generating circuit 54 of this embodiment is a false current path circuit, which falsely forms a current path extending from power supply voltage VCC on the side of data line /LIO and bit line /BL of the data read circuit system to ground voltage GND via the memory cell in the above-described embodiment.

Owing to the above structure, VBL generating circuit 54 can stably supply desirable predetermined voltage VBL.

In the first to third embodiments and the modifications already described, the complementary data lines are used for the data read operation. However, the structure of memory array 10 is not restricted to the memory arrangement for storing one bit by two MTJ memory cells, as already described.

Figure 11A:
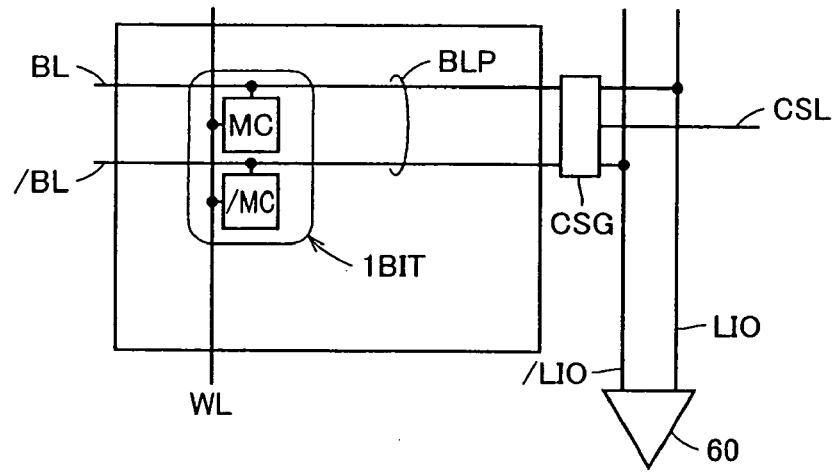
FIGS. 11A, 11B and 11C conceptually show variations of an array structure for performing a data read operation with complementary data lines.

FIG. 11A shows a memory cell arrangement for storing one bit by two MTJ memory cells, as already described in connection with the first to third embodiments and the modifications thereof. In this arrangement, two memory cells MC and /MC corresponding to the same address are connected to complementary data lines LIO (BL) and /LIO (/BL), respectively, so that data reading is executed based on the passing current difference between the complementary data lines.

The memory cell arrangement shown in FIG. 11A requires the MTJ memory cells twice as large in number as the bits to be stored. However, the data reading is executed in accordance with the passing current difference between the MTJ memory cells actually storing the complementary data. Therefore, variations in manufacturing characteristics of the tunneling magneto-resistance elements can be followed to execute the data reading with high precision.

Figure 11B:
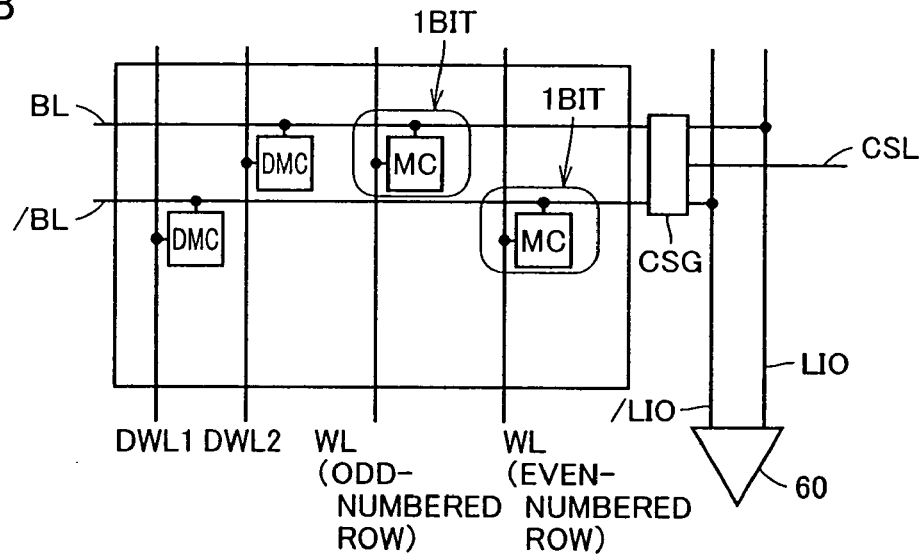
Figure 11C:
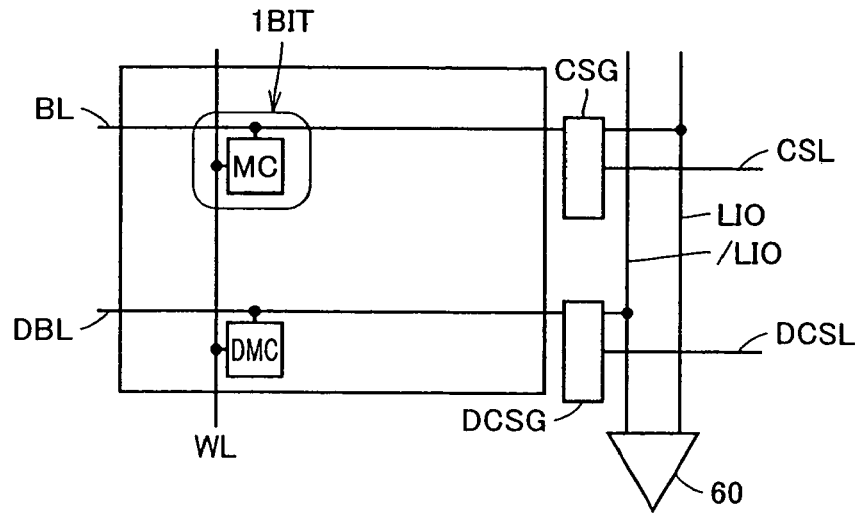

FIGS. 11B and 11C show memory cell arrangements provided with dummy memory cells having an intermediate electric resistance. A dummy memory cell DMC has an electric resistance Rm intermediate between electric resistances Rmax and Rmin, which correspond to two kinds of storage data levels ("1" and "0") of memory cell MC, respectively. Preferably, it is designed to satisfy a relationship of (Rm=Rmin+ΔR/2), where ΔR is equal to (Rmax−Rmin). Usually, dummy memory cell DMC is designed to include tunneling magneto-resistance element TMR similar to that of normal or regular MTJ memory cell MC.

According to the structure provided with dummy memory cell DMC, data of one bit is stored by one MTJ memory cell so that the required number of memory cells can be reduced.

FIG. 11B shows an example of arrangement, in which dummy memory cells DMC form a dummy row.

According to this arrangement, memory cells MC in each memory cell row are connected to bit line BL or /BL. For example, memory cells MC are arranged alternately so that memory cells MC in odd-numbered rows are connected to bit lines BL, and memory cells MC in even-numbered rows are connected to bit lines /BL.

Although not shown in great detail, dummy memory cells DMC are arranged in two dummy rows to share the memory cell columns with normal memory cells MC. Further, dummy word lines DWL1 and DWL2 are arranged corresponding to dummy rows, respectively. Each of dummy memory cells DMC in each dummy row is connected to bit line BL or /BL.

According to the above arrangement, word lines WL and dummy word lines DWL1 and DWL2 are selectively activated so that selected memory cell MC and dummy memory cell DMC can be connected to complementary data lines LIO (BL) and /LIO (/LIO), respectively. Thereby, data reading can be performed based on the passing current difference between the complementary data lines.

As shown in FIG. 11C, dummy memory cells DMC can be arranged to form a dummy column. Dummy memory cell DMC is arranged to share the memory cell row with normal memory cell MC, and dummy bit line DBL is arranged corresponding to the dummy column. Data lines LIO and /LIO are connected to the bit line and dummy bit line DBL in the selected column, respectively.

According to the above arrangement, selected memory cell MC and dummy memory cell DMC can be connected to complementary data lines LIO (BL) and /LIO (DBL) by selectively activating word line WL, respectively. Therefore, the data reading can be performed based on the passing current difference between the complementary data lines.

As described above, the structure is provided with dummy memory cell DMC, and is configured to store data of one bit by one MTJ memory cell. The structures of the data read circuit systems according to the first to third embodiments and the modifications thereof may be configured similarly to the above, and may employ dummy memory cell DMC in place of reference cell /MC, whereby the data read operation can be performed similarly.

Fifth Embodiment

A fifth embodiment will now be described in connection with a structure of a data read circuit system, which is essentially provided with the reference cell having an intermediate electric resistance, i.e., dummy memory cell DMC shown in FIGS. 11B and 11C.

Figure 12:
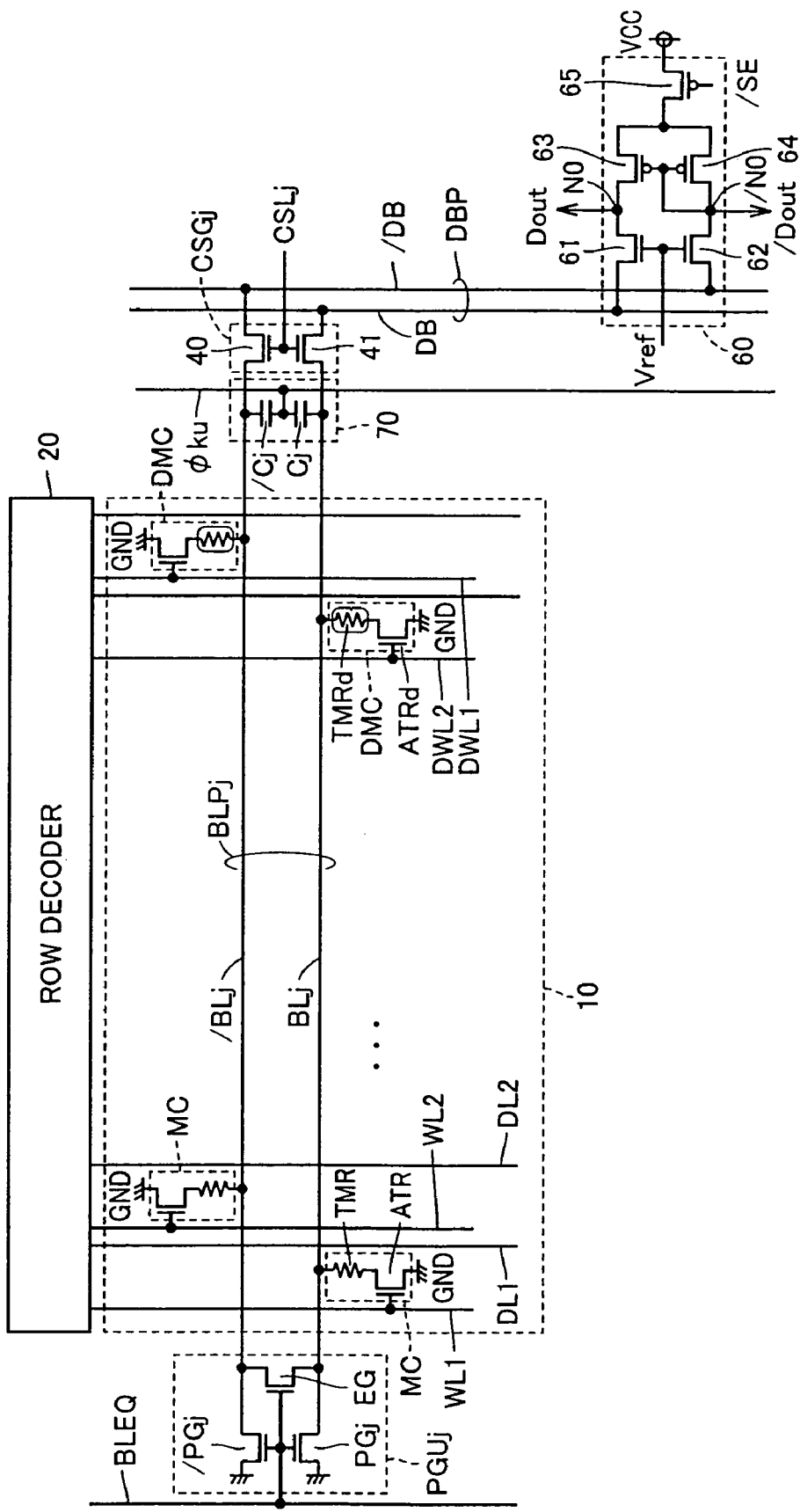
FIG. 12 is a circuit diagram showing a structure of a data read circuit system according to a fifth embodiment.

Referring to FIG. 12, memory array 10 of a data read circuit system according to a fifth embodiment is provided with memory cells MC and dummy memory cells DMC, similarly to FIG. 11B. More specifically, dummy memory cells DMC are arranged in two rows to share the memory cell columns with normal memory cells MC.

Bit line pair BLPj formed of complementary bit lines BL and /BL is arranged corresponding to each memory cell column. A precharge gate unit PGUj is also arranged corresponding to each memory cell column. Precharge gate unit PGUj includes precharge gates PG and /PG corresponding to bit lines BL and /BL in each pair, respectively. Each of precharge gates PG and /PG couples one end of corresponding bit line BL or /BL to ground voltage GND in response to bit line equalize signal BLEQ. Precharge gate unit PGUi further includes an equalize gate EG, and electrically couples bit lines BL and /BL together in response to bit line equalize signal BLEQ.

Memory cells MC are arranged alternately so that memory cells MC in the odd-numbered rows are connected to bit lines BL, and memory cells MC in the even-numbered rows are connected to bit lines /BL. Memory cell MC has tunneling magneto-resistance element TMR and access element (access transistor) ATR, which are connected between corresponding bit line BL or /BL and ground voltage GND. Access transistor ATR is turned on in response to activation of corresponding word line WL.

Dummy word lines DWL1 and DWL2 are arranged corresponding to each row of the dummy memory cells. A dummy memory cell group corresponding to dummy word line DWL1 has a dummy magneto-resistance element TMRd and a dummy access element (access transistor) ATRd, which are connected between corresponding bit line /BL and ground voltage GND. Dummy access element ATRd is turned on in accordance with dummy word line DWL1, which becomes active when an odd-numbered row is selected.

The other dummy memory cell group corresponding to dummy word line DWL2 has dummy magneto-resistance element TMRd and dummy access element (access transistor) ATRd, which are connected between corresponding bit line BL and ground voltage GND. Dummy access element ATRd is turned on in accordance with dummy word line DWL2, which becomes active when an even-numbered row is selected.

Each dummy memory cell DMC is designed to have electric resistance Rm equal to (Rmin+$\Delta$R/2). For example, dummy tunneling magneto-resistance element TMRd is formed of tunneling magneto-resistance element TMR, which is similar to that of memory cell MC and stores the data corresponding to electric resistance Rmin, and the on resistance of dummy access element ATRd is set to a value larger than that of access transistor ATR by $\Delta$R/2, whereby dummy memory cell DMC is formed. Alternatively, dummy access element ATRd may be designed to have an on resistance similar to that of access transistor ATR, and dummy magneto-resistance element TMRd may be formed of a series connection of tunneling magneto-resistance element TMR storing data corresponding to electric resistance Rmin and a fixed resistance having an electric resistance of $\Delta$R/2. In this manner, dummy memory cell DMC may be formed.

FIG. 12 representatively shows first and second word lines WL1 and WL2 corresponding to first and second memory cell rows, respectively, first and second digit lines DL1 and DL2, bit lines BLj and /BLj corresponding to the memory cell column in the jth position, and memory cells MC and dummy memory cells DMC corresponding to these lines.

The structure according to the fifth embodiment is further provided with column select gate CSG arranged corresponding to each memory cell column as well as complementary data buses DB and /DB neighboring to memory array 10. Data buses DB and /DB form a data bus pair DBP.

Column select gate CSG is connected between ends on the other side of bit lines BL and /BL, and data buses DB and /DB, and is turned on in response to the activation of corresponding column select line CSL. For example, column select gate CSGj responds to activation of column select line CSLj so that transistors 40 and 41 are turned on to connect the ends on the other side of bit lines BLj and /BLj to data buses DB and /DB, respectively.

Differential amplifier 60 is connected to data bus lines DB and /DB for amplifying and converting a passing current difference between data bus lines DB and /DB into a voltage difference between nodes N0 and /N0.

A level control circuit 70 for controlling voltage levels of bit lines BLj and /BLj in the data read operation is provided for bit lines BLj and /BLj.

Level control circuit 70 includes capacitors /Cj and Cj connected in series between bit lines BL and /BL as well as a signal line $\phi$ku electrically coupled to a connection node between capacitors /Cj and Cj.

Figure 13:
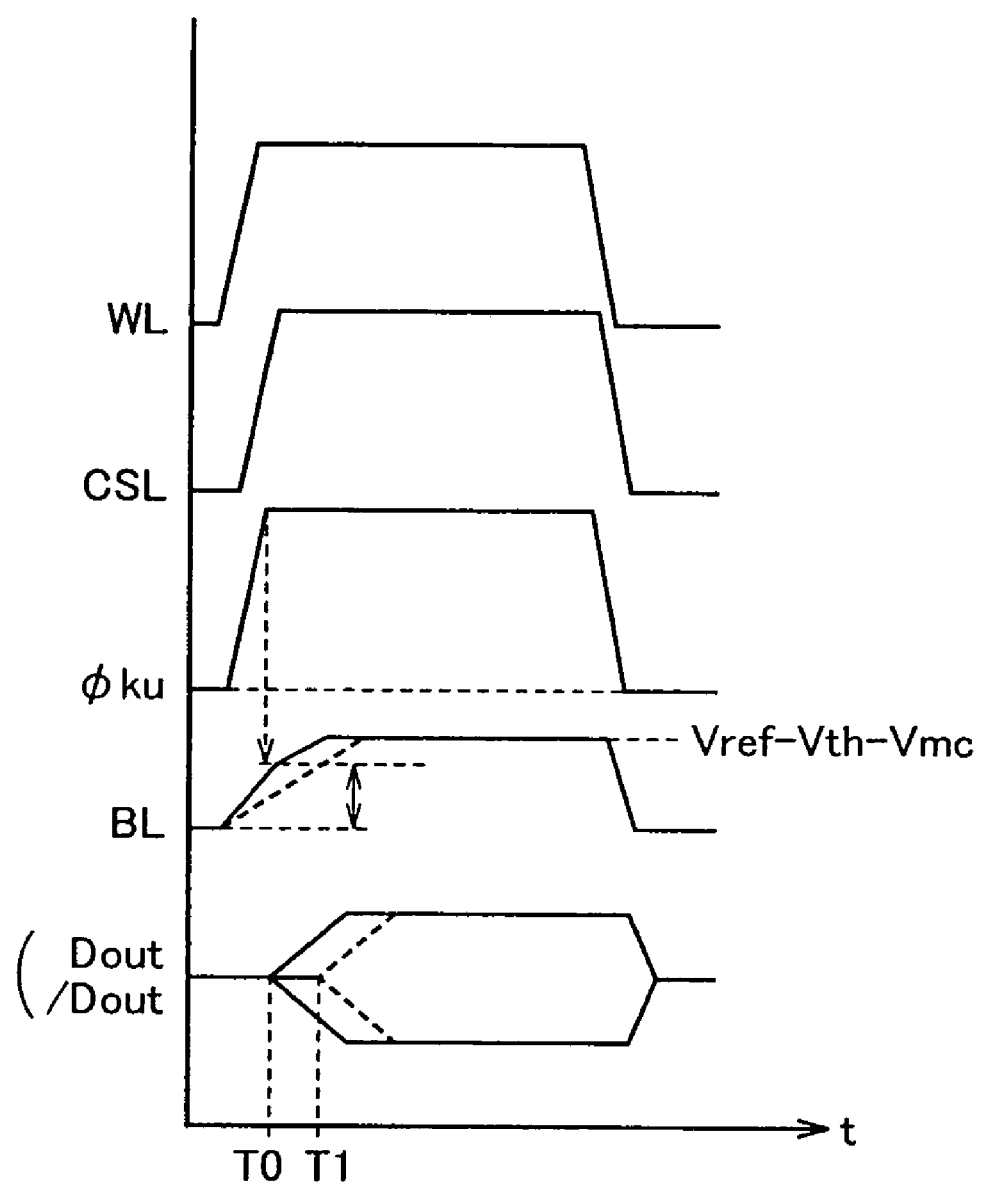
FIG. 13 is a timing chart illustrating a data read operation of an MRAM device according to the fifth embodiment.

Referring to FIG. 13, description will now be given on the data read operation in the MRAM device according to the fifth embodiment.

Before the data reading, each word line WL is inactive so that bit lines BL and /BL are isolated from memory cell MC and dummy memory cell DMC, respectively. Since bit line precharge signal BLPR is active, each of bit lines BL and /BL is in the state precharged to ground voltage GND.

Since each column select line CSL is inactive, data buses DB and /DB are isolated from bit lines BL and /BL.

In the data read operation, bit line precharge signal BLPR is inactive, and each of bit lines BL and /BL is isolated from ground voltage GND. Further, in response to the address selection, the word line in the selected row, the column select line in the selected column and one of dummy word lines DWL1 and DWL2 are selectively activated.

In response to the above, data bus DB and bit line BL in the selected column are electrically coupled between power supply voltage VCC and ground voltage GND via one of selected memory cell MC and dummy memory cell DMC. Likewise, data bus /DB and bit line /BL in the selected column are electrically coupled between power supply voltage VCC and ground voltage GND via the other of selected memory cell MC and dummy memory cell DMC.

In the above operation, signal line $\phi$ku becomes active. In response to this, the voltage levels of bit lines BLj and /BLj can be raised by the capacity coupling of capacitors Cj and /Cj.

In accordance with the above, the detectable passing current difference corresponding to the storage data can be rapidly produced between data buses DB and /DB at time t0.

In accordance with the passing current difference between data buses DB and /DB, a voltage difference corresponding to the storage data of selected memory cell MC occurs between nodes N0 and /N0. Consequently, differential amplifier 60 can produce read data DOUT reflecting the level of the storage data of selected memory cell MC.

Owing to the provision of level control circuit 70, as illustrated in FIG. 13, production of the passing current difference corresponding to the storage data can start at a time T0 earlier than a time T1, at which a detectable passing current difference occurs in the structure without level control circuit 70.

Even if data bus DB is connected to dummy memory cell DMC, it is not particularly required to switch the connection between the input side of differential amplifier 60 and data buses DB and /DB, and the data read operation can be similarly executed based on the passing current difference between the selected memory cell MC and dummy memory cell DMC.

A voltage difference does not occur between bit lines BLj and /BLj as well as between data buses DB and /DB, and a voltage of "Vref−Vth−Vmc" is stably kept on each of data buses DB and /DB and bit lines BLj and /BLj, similarly to the foregoing case. Vth corresponds to threshold voltages of transistors 61 and 62, and Vmc corresponds to a voltage drop caused in memory cell MC and dummy memory cell DMC.

According to the structure of the fifth embodiment, as already described, signal line φku is activated in the data read operation, and the capacity coupling of capacitors Cj and /Cj raises the voltage levels of bit lines BLj and /BLj so that the charging time of data bus pair DBP can be reduced, and the storage data can be read early. Thus, it is possible to reduce the charging time required for charging the data bus line pair to the predetermined voltage level, and the data reading can be performed fast.

First Modification of Fifth Embodiment

Figure 14:
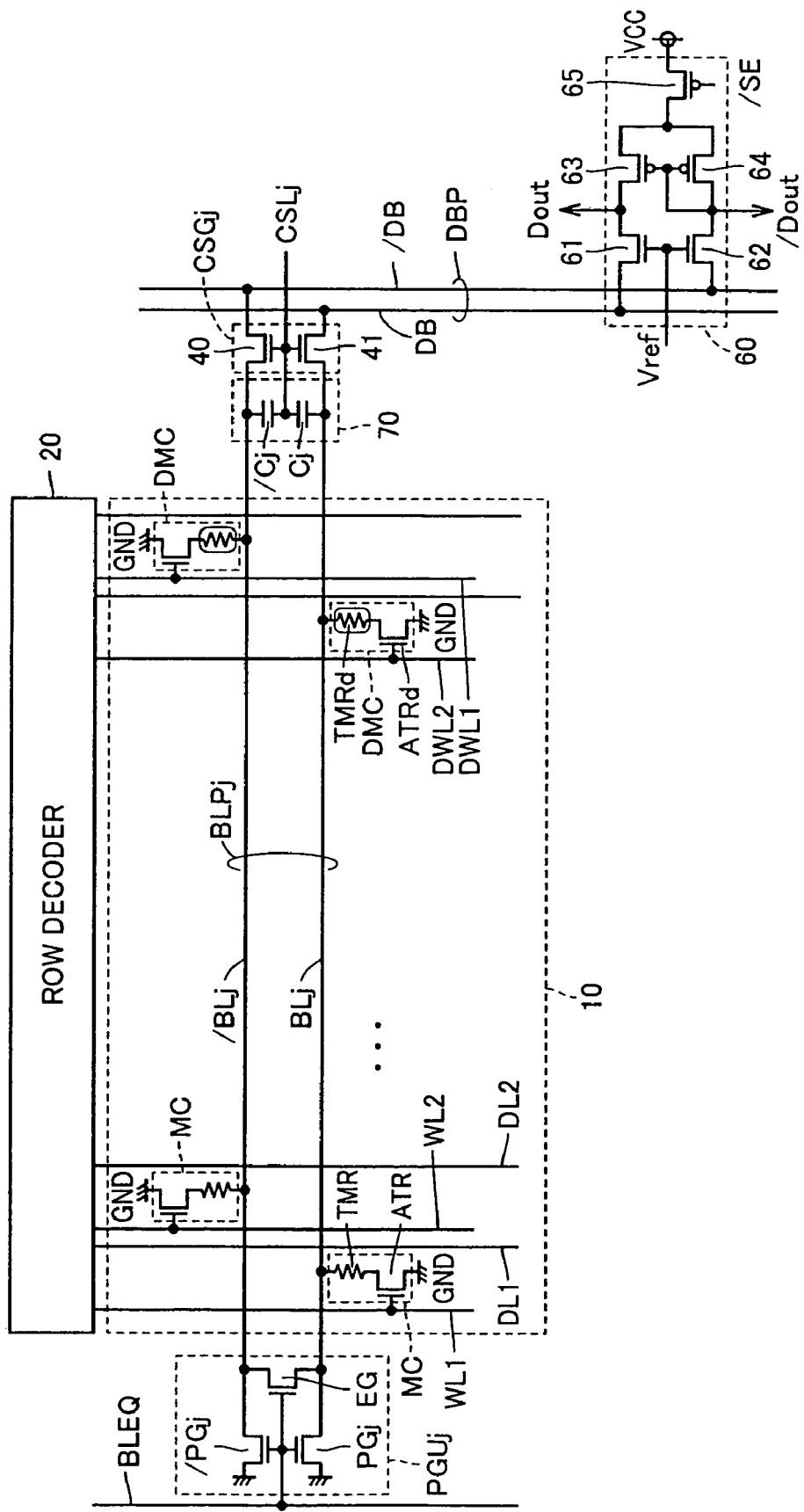
FIG. 14 is a circuit diagram showing a structure of a data read circuit system according to a first modification of the fifth embodiment.

Referring to FIG. 14, a structure of a data read circuit system according to a first modification of the fifth embodiment differs from the structure of the fifth embodiment in that the connection node between capacitors Cj and /Cj of level control circuit 70 is electrically connected to column select line CSLj. Consequently, signal line φku is not required, and thus is removed.

Figure 15:
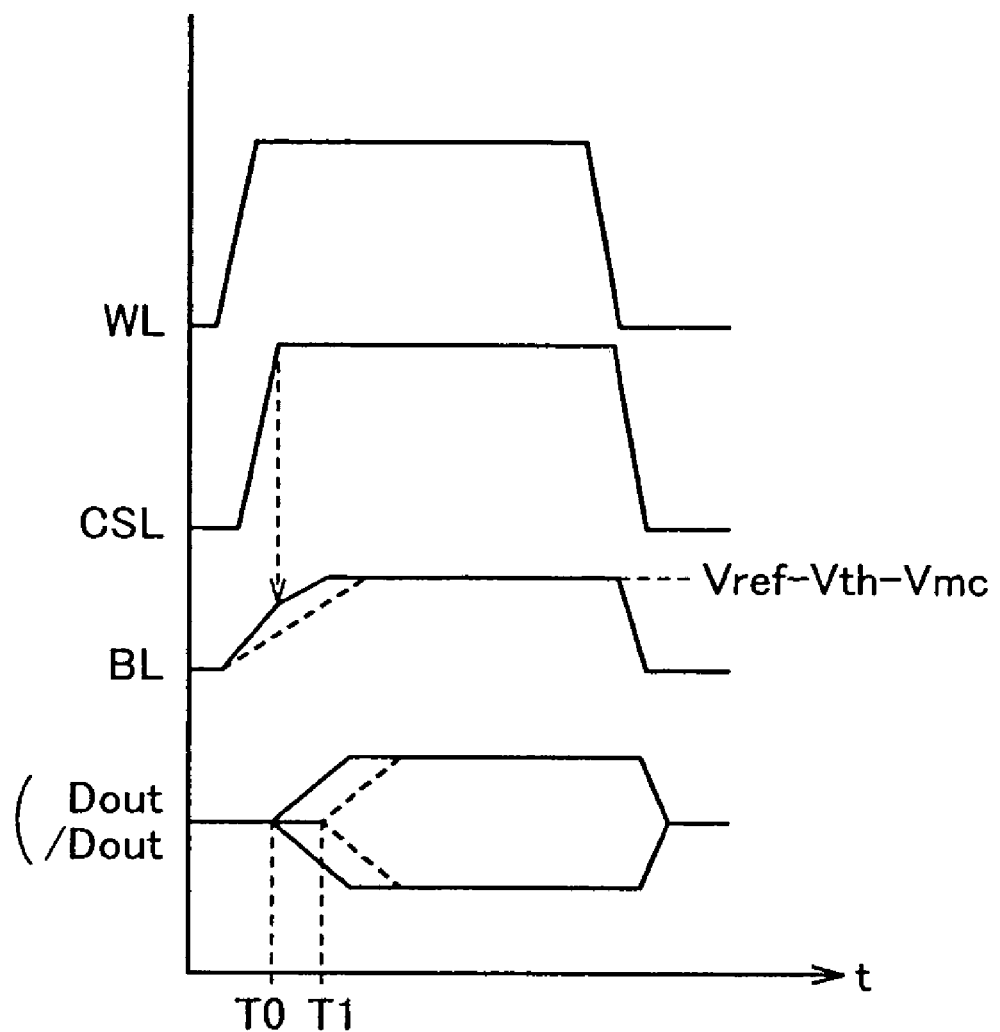
FIG. 15 is a timing chart illustrating a data read operation of an MRAM device according to the first modification of the fifth embodiment.

Referring to FIG. 15, description will now be given on the data read operation in the MRAM device according to the first modification of the fifth embodiment.

Operations before the data reading are the same as those in the fifth embodiment already described, and therefore description thereof is not repeated.

The operations differs from those in the fifth embodiment in that the voltage levels of bit lines BLj and /BLj are raised by the capacity coupling of capacitors Cj and /Cj in accordance with the same timing as the selective activation of the word line in the selected row, the column select line in the selected column and one of dummy word lines DWL1 and DWL2. Operations other than the above are substantially the same as those already described, and therefore, description thereof is not repeated.

Owing to the above structures, fast and accurate data reading can be performed similarly to the data read operation according to the fifth embodiment. Since column select line CSL can be used instead of signal line φku for raising the voltage levels of bit lines BLj and /BLj by the capacity coupling, the parts can be reduced in number.

Second Modification of the Fifth Embodiment

The first modification of the fifth embodiment has been described in connection with the structure, in which signal line φku is used instead of column select line CSL for raising the voltage levels of bit lines BL and /BL by the capacity coupling. In this case, however, capacitors Cj and /Cj are charged based on the voltage level of column select line CSL, and the voltage levels of the corresponding bit lines are raised by the capacity coupling. Therefore, the voltage levels of bit lines BL and /BL may rise excessively to destroy the data of the memory cell when the voltage level of column select line CSL is high.

The second modification of the fifth embodiment is aimed at setting of the voltage levels of bit lines BL and /BL to or below a predetermined voltage level.

Figure 16:
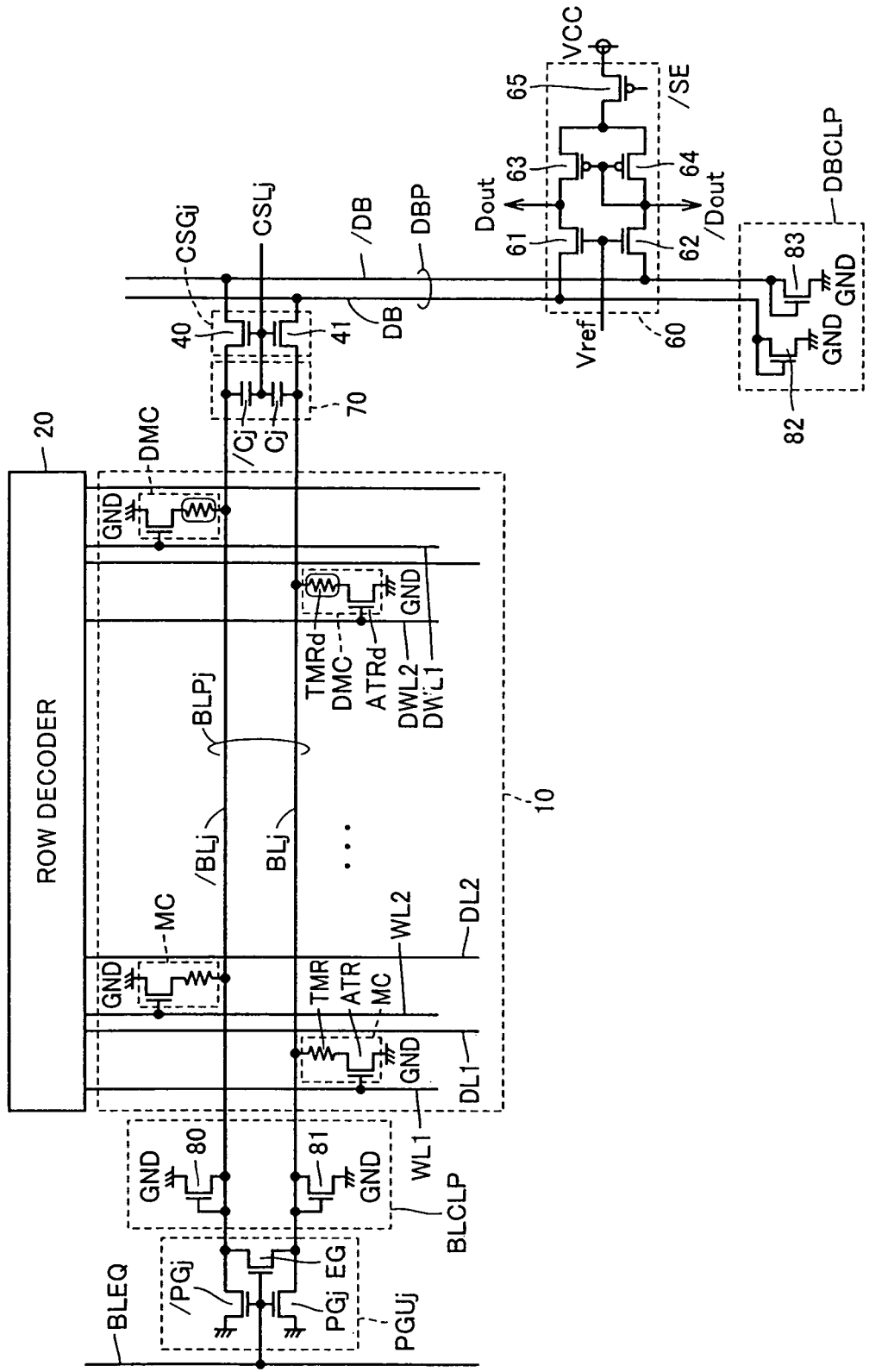
FIG. 16 shows a structure of a read circuit system according to a second modification of the fifth embodiment.

Referring to FIG. 16, a read circuit system according to the second modification of the fifth embodiment differs from the read circuit system shown in FIG. 14 in that bit line clamp circuits BLCLP and data bus clamp circuit DBCLP are additionally employed. Structures other than the above are substantially the same as those of the first modification of the fifth embodiment, and therefore description thereof is not repeated.

Bit line clamp circuit BLCLP includes so-called diode-connected transistors 80 and 81.

More specifically, transistor 80 is connected between ground voltage GND and bit line /BL, and has a gate connected to bit line /BL. Transistor 81 is connected between ground voltage GND and bit line BL, and has a gate connected to bit line BL.

Data bus clamp circuit DBCLP includes so-called diode-connected transistors 82 and 83. More specifically, transistor 82 is connected between ground voltage GND and data bus DB, and has a gate connected to data bus DB. Transistor 83 is connected between ground voltage GND and data bus /DB, and has a gate connected to data bus /DB.

Bit line clamp circuit BLCLP lowers the voltage levels of bit lines BL and /BL to or below a predetermined voltage level. Data bus line damp circuit DBCLP lowers the voltage levels of data buses DB and /DB to or below a predetermined voltage level.

The predetermined voltage level is set based on the assumption that the on voltage of the diode is equal to "Vref−Vth−Vmc" is used as.

Owing to the above structure, the voltage levels of bit line pair BLP and data line pair DBP are suppressed not to exceed the predetermined voltage level, and the data reading can be executed more stably than the data read operation according to the first modification of the fifth embodiment.

This embodiment can be applied to the fifth embodiment.

The structures have been described in connection with the diode-connected transistors. However, this is not restrictive and, for example, ordinary diodes may be alternatively used.

In the structures described above, since the ground voltage is used as the precharge voltage, bit line clamp circuit BLCLP and data bus line clamp circuit DBCLP are used for lowering the voltage levels to or below the predetermined levels. If a fixed voltage other than the ground voltage is used as the precharge voltage, the structure is not restricted to the above, and such a structure may be employed that bit line clamp circuit BLCLP and data bus clamp circuit DBCLPare used to raise the voltage level to or above a predetermined level.

Third Modification of the Fifth Embodiment

The fifth embodiment and the modifications thereof have been described in connection with the voltage levels of the bit lines and data lines in the data read operation. However, a third modification of the fifth embodiment will now be described in connection with the precharge circuit for precharging the bit lines before the data reading.

Figure 17:
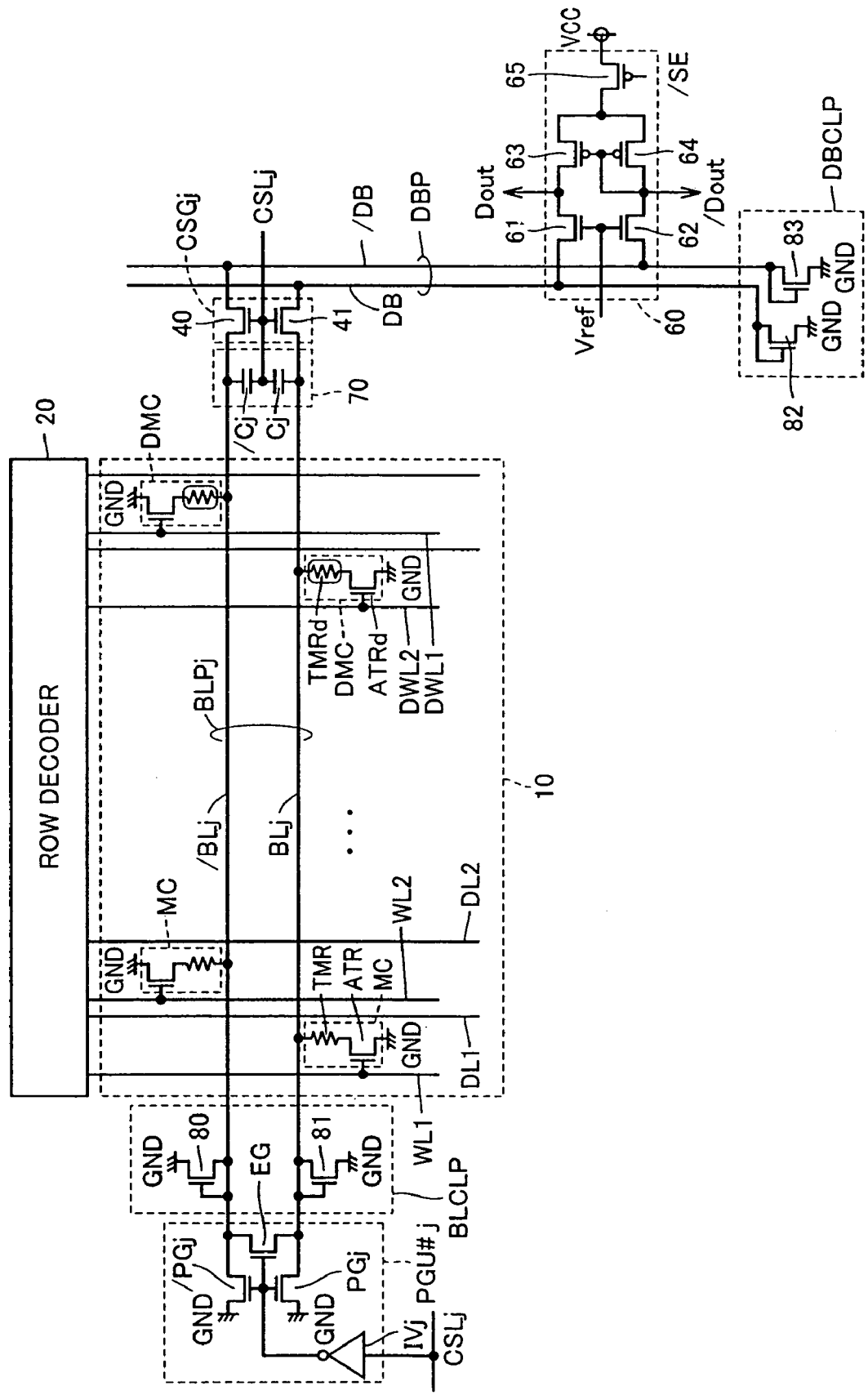
FIG. 17 shows a structure of a read circuit system according to a third modification of the fifth embodiment.

Referring to FIG. 17, a read circuit system according to the third modification of the fifth embodiment differs from the read circuit system shown in FIG. 16 in that a precharge gate unit PGU#J is used instead of precharge gate unit PGUj.

Precharge gate unit PGU#j differs from precharge gate unit PGUj in that an inverter IVj electrically connected to column select line CSLj is additionally employed. Precharge gate unit PGU#j is activated by receiving an inverted signal of column select line CSLj.

Therefore, the precharging starts in response to deactivation of column select line CSLj, and ends in response to activation thereof.

According to the above structure, bit line pair BLP can be precharged without using bit line equalize signal BLEQ so that an interconnection layer can be eliminated, and the number of parts can be smaller than that in: the second modification of the fifth embodiment. The above structure can likewise be applied to the fifth embodiment and the first modification thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
   a plurality of memory cells each having one of first and second electric resistances corresponding to magnetically written storage data;
   a reference cell having an electric resistance intermediate between said first and second electric resistances;
   a first data line being electrically coupled between first and second voltages via the selected memory cell corresponding to a selected address among said plurality of memory cells during data reading;
   a second data line being electrically coupled between said first and second voltages via said reference cell during said data reading;
   a level control circuit provided corresponding to said first and second data lines for changing levels of said first and second data lines to predetermined levels during said data reading;
   a data read circuit for performing a data read operation in accordance with a difference between passing currents of said first and second data lines; and
   a signal line for instructing voltage change of said predetermined level to said level control circuit, wherein
   said level control circuit includes capacitors each arranged between said first or second data line and an internal node, and said internal node is electrically coupled to said signal line.

2. A thin film magnetic memory device comprising:
   a plurality of memory cells each having one of first and second electric resistances corresponding to magnetically written storage data;
   a reference cell having an electric resistance intermediate between said first and second electric resistances;
   a first data line being electrically coupled between first and second voltages via the selected memory cell corresponding to a selected address among said plurality of memory cells during data reading;
   a second data line being electrically coupled between said first and second voltages via said reference cell during said data reading;
   a level control circuit provided corresponding to said first and second data lines for changing levels of said first and second data lines to predetermined levels during said data reading;
   a data read circuit for performing a data read operation in accordance with a difference between passing currents of said first and second data lines; and
   a column select line for transmitting a result of column selection, wherein
   said level control circuit includes capacitors each arranged between said first or second data line and an internal node, and said internal node being electrically coupled to said column select line.

3. A thin film magnetic memory device comprising:
   a plurality of memory cells each having one of first and second electric resistances corresponding to magnetically written storage data;
   a reference cell having an electric resistance intermediate between said first and second electric resistances;
   a first data line being electrically coupled between first and second voltages via the selected memory cell corresponding to a selected address among said plurality of memory cells during data reading;
   a second data line being electrically coupled between said first and second voltages via said reference cell during said data reading;
   a level control circuit provided corresponding to said first and second data lines for changing levels of said first and second data lines to predetermined levels during said data reading;
   a data read circuit for performing a data read operation in accordance with a difference between passing currents of said first and second data lines; and
   a clamp circuit provided corresponding to each of said first and second lines for maintaining voltage levels of said first and second data lines at said predetermined level during said data reading.

4. The thin film magnetic memory device according to claim 3, wherein
   said clamp circuit includes a diode element arranged between a predetermined voltage and said first and second data lines.

5. The thin film magnetic memory device according to claim 3, wherein
   said clamp circuit includes a field-effect transistor arranged between a predetermined voltage and each of said first and second data lines, and
   said field-effect transistor has a gate electrically coupled to corresponding one of said first and second data lines.

* * * * *